(12) United States Patent
Kimura et al.

(10) Patent No.: US 10,804,272 B2
(45) Date of Patent: Oct. 13, 2020

(54) SEMICONDUCTOR DEVICE

(71) Applicant: Semiconductor Energy Laboratory Co., Ltd., Atsugi-shi, Kanagawa-ken (JP)

(72) Inventors: Hajime Kimura, Kanagawa (JP); Miki Suzuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 20 days.

(21) Appl. No.: 15/624,975

(22) Filed: Jun. 16, 2017

(65) Prior Publication Data

US 2017/0373067 A1    Dec. 28, 2017

(30) Foreign Application Priority Data

Jun. 22, 2016 (JP) .................. 2016-123177
Sep. 26, 2016 (JP) .................. 2016-186855

(51) Int. Cl.
| | | |
|---|---|---|
| H01L 29/10 | (2006.01) | |
| H01L 27/105 | (2006.01) | |
| H01L 21/822 | (2006.01) | |
| H01L 27/06 | (2006.01) | |
| H01L 27/1156 | (2017.01) | |
| H01L 27/12 | (2006.01) | |
| H01L 29/786 | (2006.01) | |

(52) U.S. Cl.
CPC ...... *H01L 27/1052* (2013.01); *H01L 21/8221* (2013.01); *H01L 27/0688* (2013.01); *H01L 27/1156* (2013.01); *H01L 27/124* (2013.01); *H01L 27/1207* (2013.01); *H01L 27/1225* (2013.01); *H01L 27/1255* (2013.01); *H01L 29/7869* (2013.01); *H01L 29/78609* (2013.01)

(58) Field of Classification Search
CPC ............. H01L 27/1052; H01L 27/1225; H01L 27/124; H01L 27/1255; H01L 29/7869
USPC ............................................... 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jay C Kim
(74) *Attorney, Agent, or Firm* — Fish & Richardson P.C.

(57) ABSTRACT

A semiconductor device capable of retaining data for a long time is provided. A leakage current path between adjacent memory cells in a memory cell array included in the semiconductor device is blocked without increasing the number of manufacturing steps, so that memory retention characteristics can be improved.

9 Claims, 28 Drawing Sheets

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,058,647 B2 * | 11/2011 | Kuwabara ............... H01L 29/04 257/43 |
| 8,421,083 B2 | 4/2013 | Yamazaki et al. |
| 8,686,425 B2 | 4/2014 | Yamazaki et al. |
| 8,709,889 B2 * | 4/2014 | Saito .................... H01L 21/84 257/296 |
| 8,723,176 B2 * | 5/2014 | Yamazaki ........... H01L 29/7869 257/43 |
| 8,796,683 B2 * | 8/2014 | Yamazaki ............. H01L 29/045 257/43 |
| 8,860,108 B2 | 10/2014 | Yamazaki et al. |
| 8,865,555 B2 * | 10/2014 | Yamazaki ......... H01L 29/66742 438/296 |
| 8,946,702 B2 * | 2/2015 | Yamazaki ........... H01L 29/7869 257/43 |
| 8,952,377 B2 * | 2/2015 | Yamazaki ........... H01L 29/7869 257/43 |
| 8,987,731 B2 * | 3/2015 | Yamazaki ......... H01L 29/78693 257/43 |
| 9,059,219 B2 | 6/2015 | Sasagawa et al. |
| 9,153,699 B2 * | 10/2015 | Yamazaki ............... H01L 29/24 |
| 9,209,256 B2 | 12/2015 | Tokunaga et al. |
| 9,214,474 B2 * | 12/2015 | Yamazaki ........... H01L 27/1225 |
| 9,245,958 B2 * | 1/2016 | Yamazaki ........... H01L 29/7869 |
| 9,287,258 B2 * | 3/2016 | Saito ................ H01L 27/11524 |
| 9,293,540 B2 | 3/2016 | Yamazaki |
| 9,318,618 B2 * | 4/2016 | Endo .................. H01L 29/7869 |
| 9,419,018 B2 | 8/2016 | Sasagawa et al. |
| 9,450,102 B2 | 9/2016 | Noda et al. |
| 9,461,179 B2 * | 10/2016 | Kobayashi ........... H01L 29/045 |
| 9,530,856 B2 * | 12/2016 | Miyairi ............... H01L 29/4958 |
| 9,653,611 B2 * | 5/2017 | Atsumi ............... G11C 11/4085 |
| 9,660,100 B2 | 5/2017 | Okazaki |
| 9,666,697 B2 | 5/2017 | Tanaka et al. |
| 9,673,224 B2 * | 6/2017 | Yamazaki ......... H01L 29/42384 |
| 9,690,464 B2 * | 6/2017 | Takama ................ G06F 3/0412 |
| 9,716,003 B2 | 7/2017 | Yamazaki |
| 9,722,091 B2 * | 8/2017 | Yamazaki ........... H01L 29/7869 |
| 9,754,978 B2 * | 9/2017 | Ueda .................... H01L 27/101 |
| 9,847,431 B2 * | 12/2017 | Yamazaki ............... H01L 29/24 |
| 9,882,014 B2 * | 1/2018 | Nakazawa ........... H01L 29/045 |
| 9,882,059 B2 * | 1/2018 | Yamazaki ........... H01L 29/7869 |
| 10,096,715 B2 * | 10/2018 | Yamazaki ......... H01L 29/78606 |
| 10,263,117 B2 * | 4/2019 | Ito ....................... H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0193433 A1 * | 8/2013 | Yamazaki ......... H01L 29/66969 257/43 |
| 2014/0014947 A1 | 1/2014 | Yamazaki |
| 2014/0027762 A1 * | 1/2014 | Tsurume ................ H01L 29/24 257/43 |
| 2015/0325708 A1 * | 11/2015 | Yakubo ................ H01L 27/092 257/43 |
| 2015/0349132 A1 | 12/2015 | Yamazaki |
| 2016/0111548 A1 | 4/2016 | Yamazaki |
| 2017/0033111 A1 * | 2/2017 | Yamazaki ......... H01L 27/10873 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-119674 A | 6/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase "", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symnposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Ocide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 2, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a $Zn_4s$ conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Disgest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

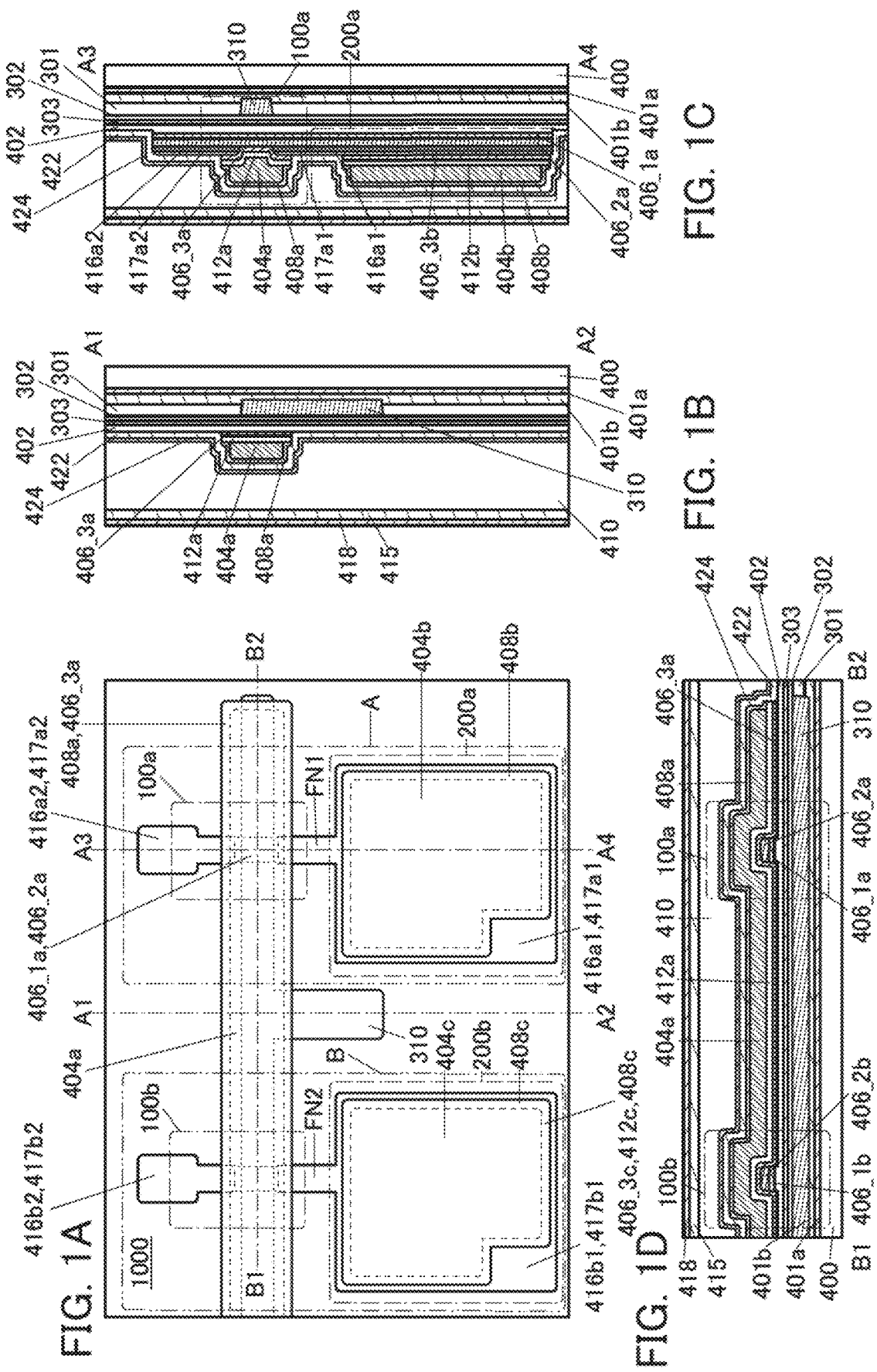

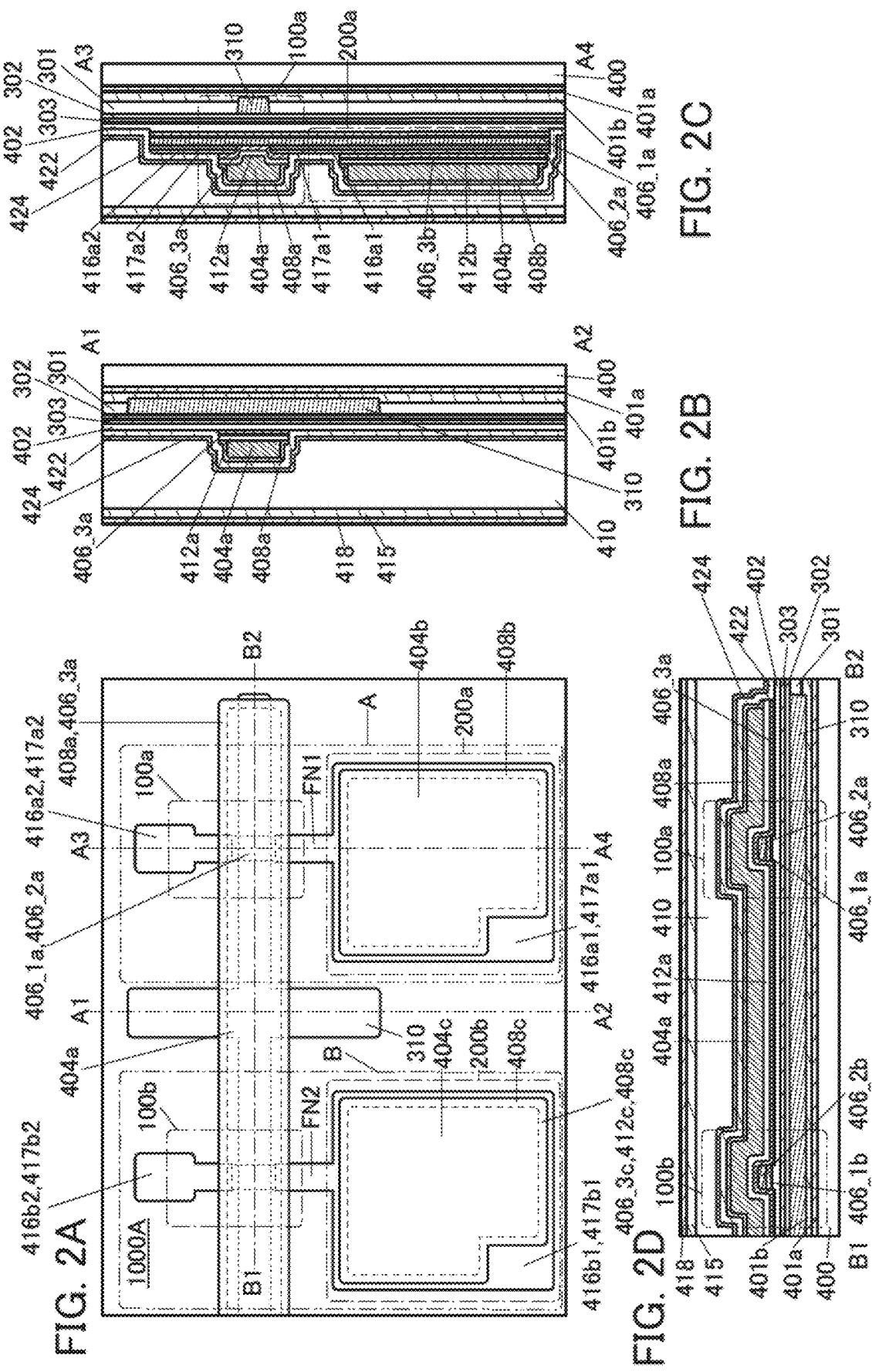

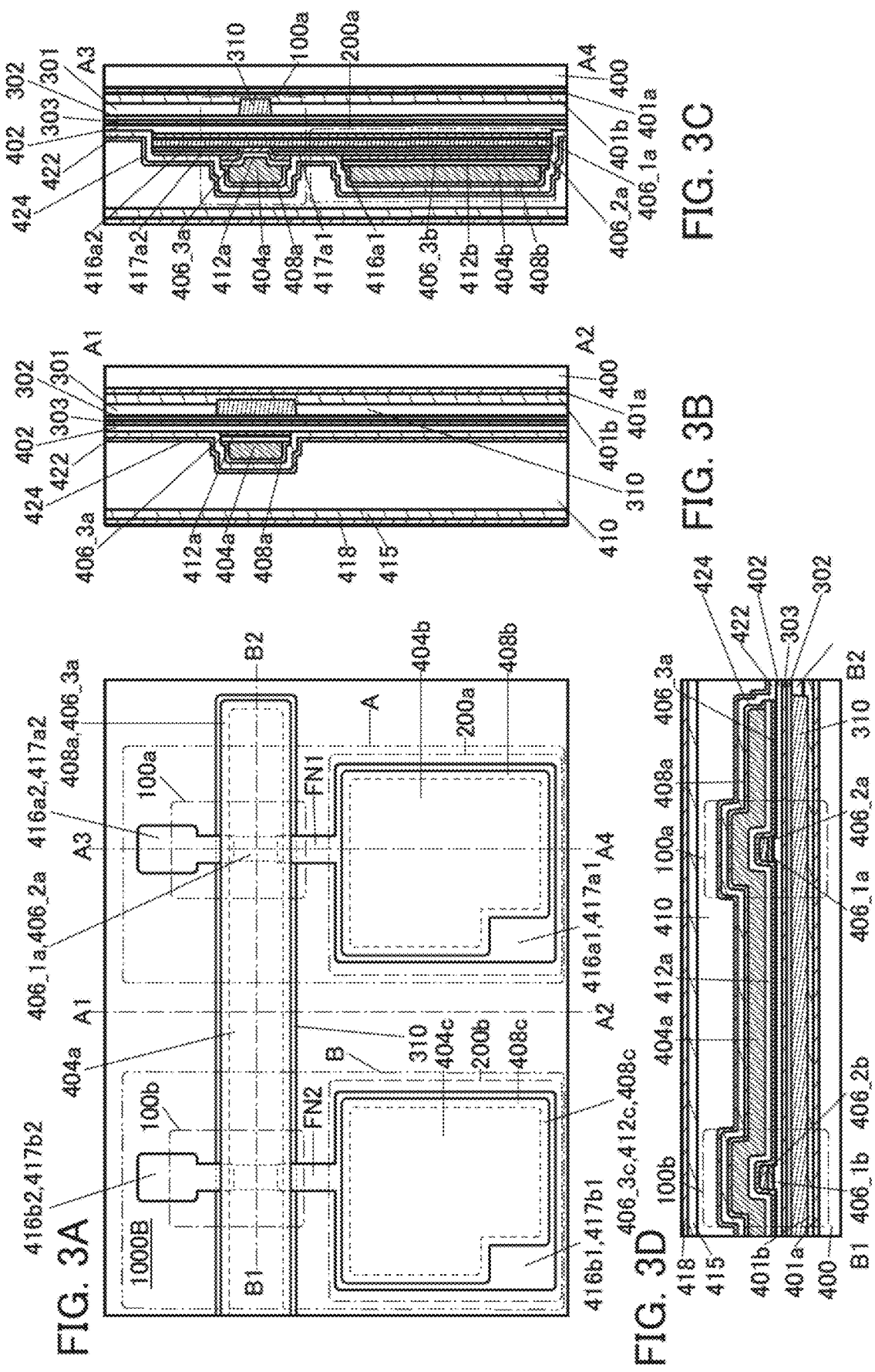

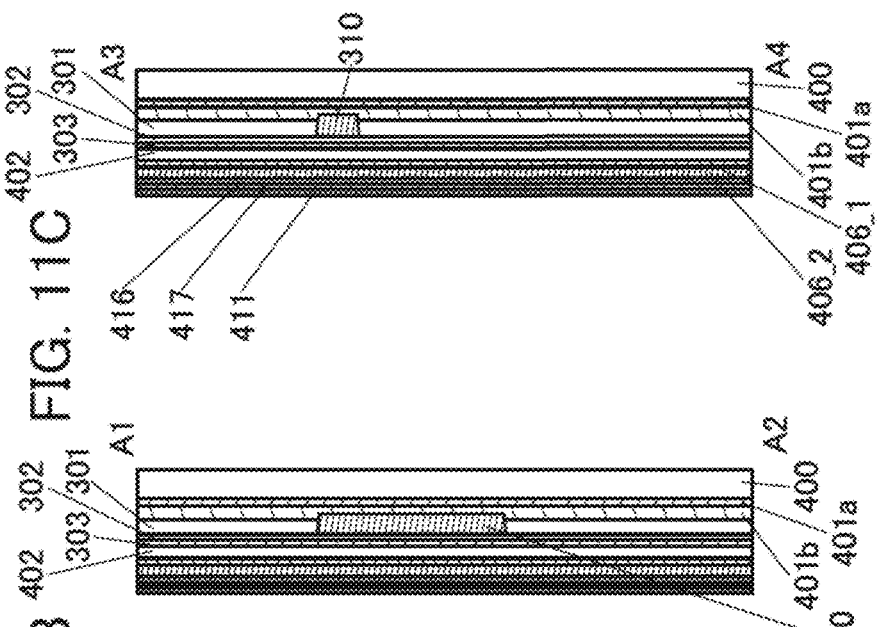
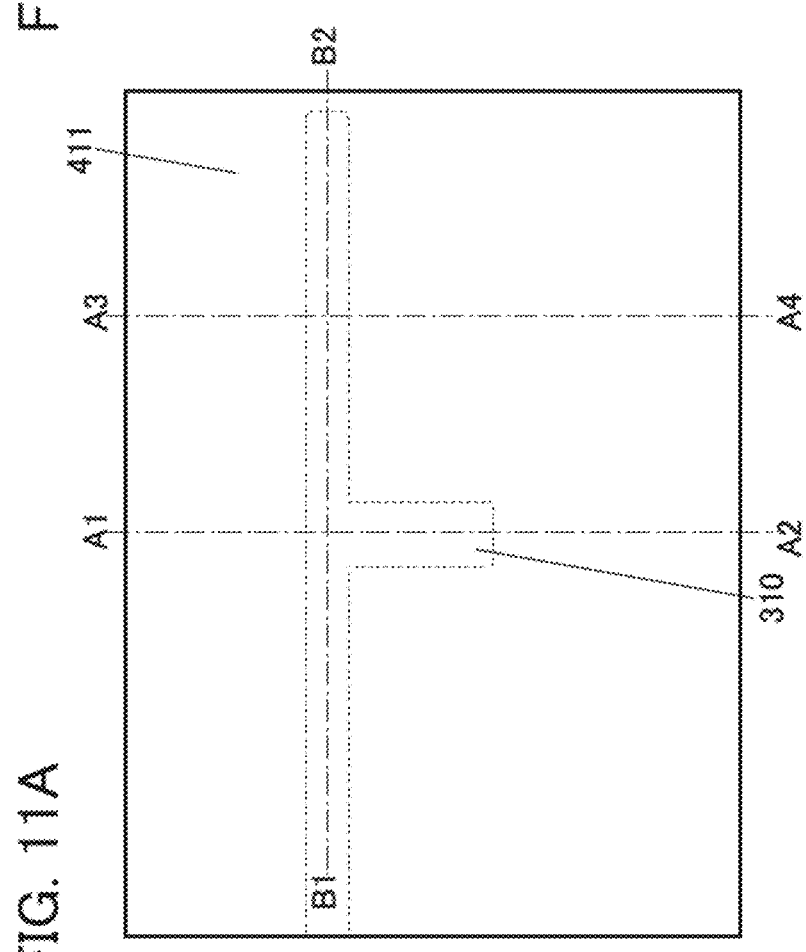
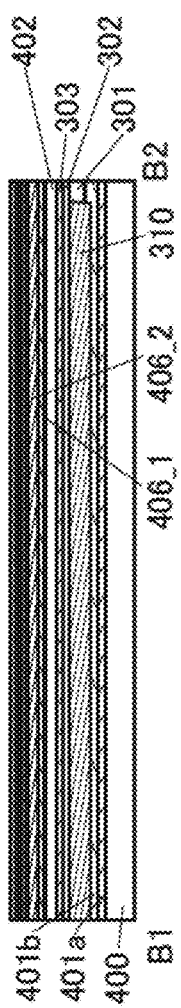

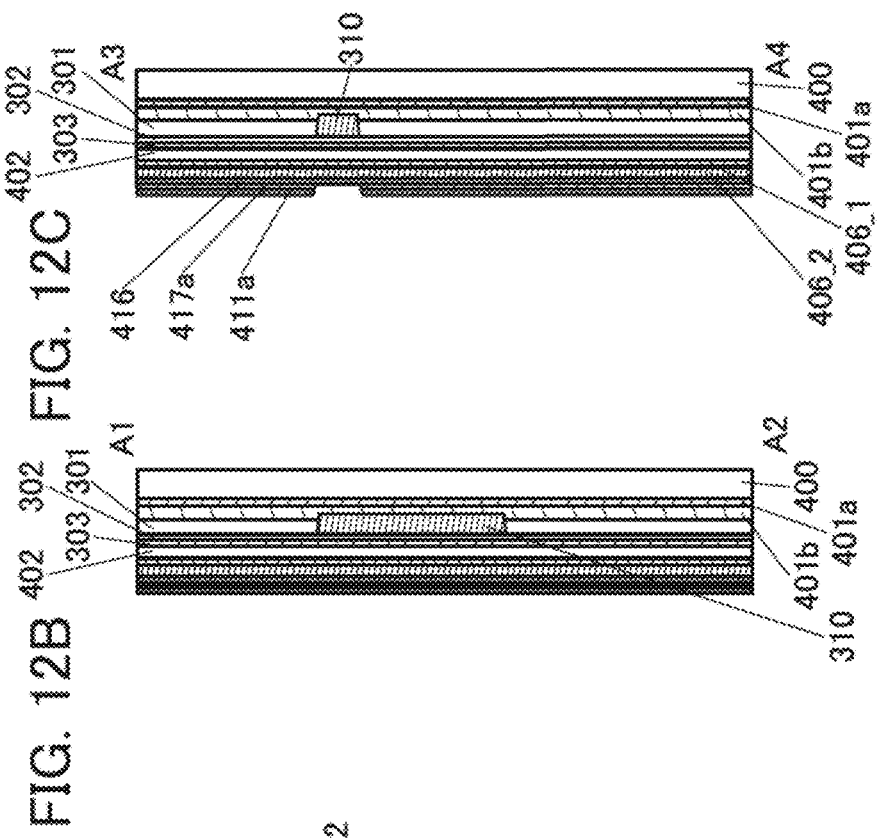
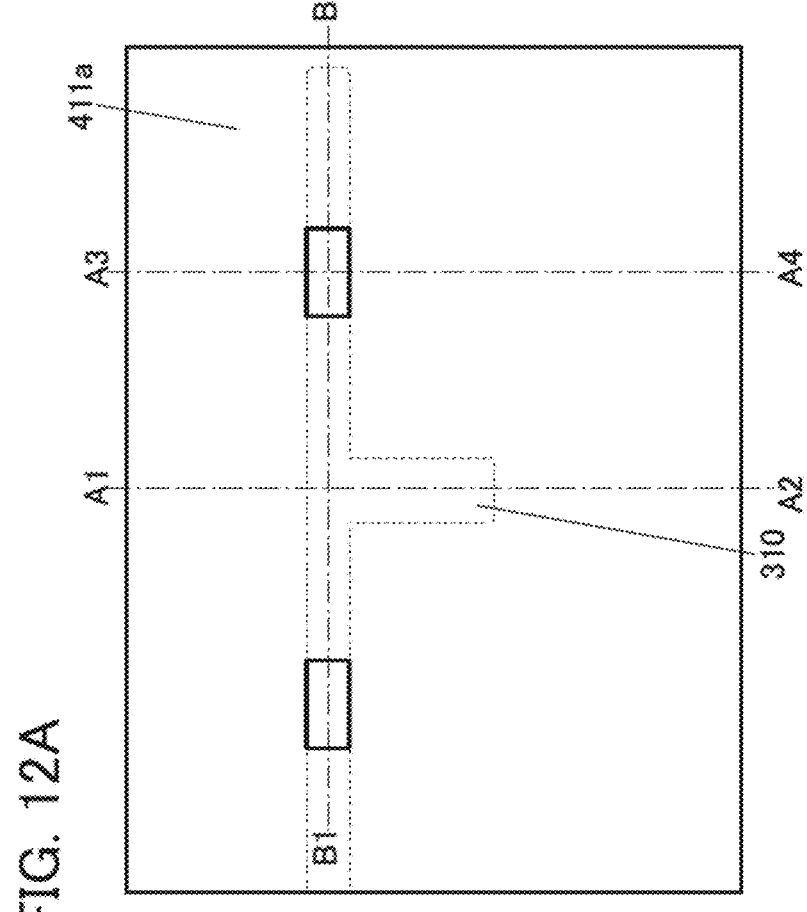
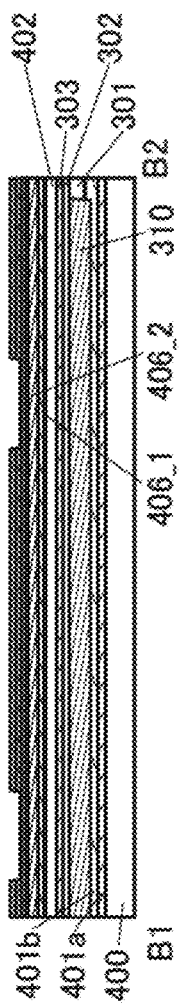
FIG. 12A  FIG. 12B  FIG. 12C  FIG. 12D

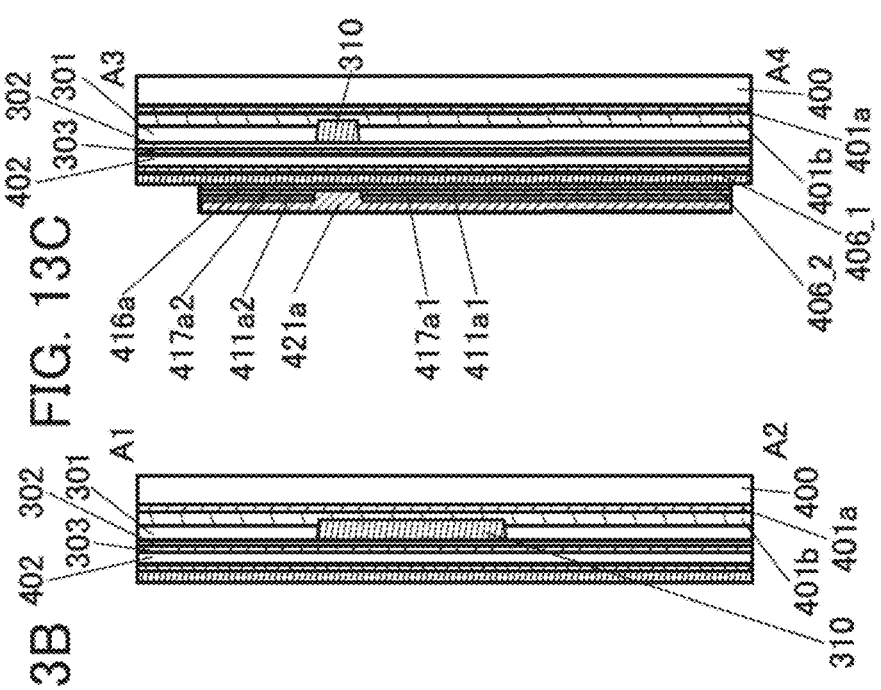
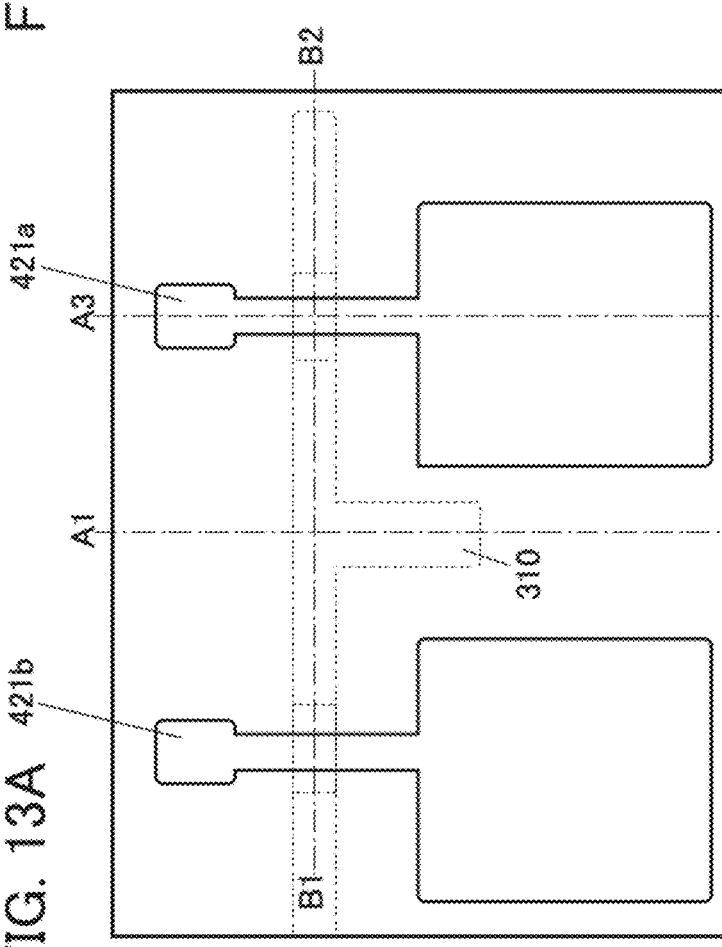
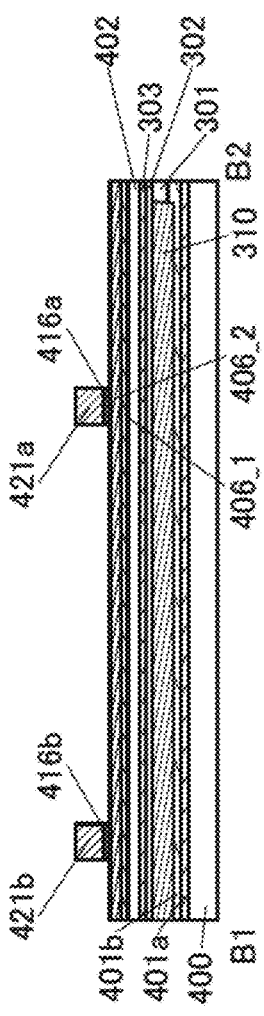

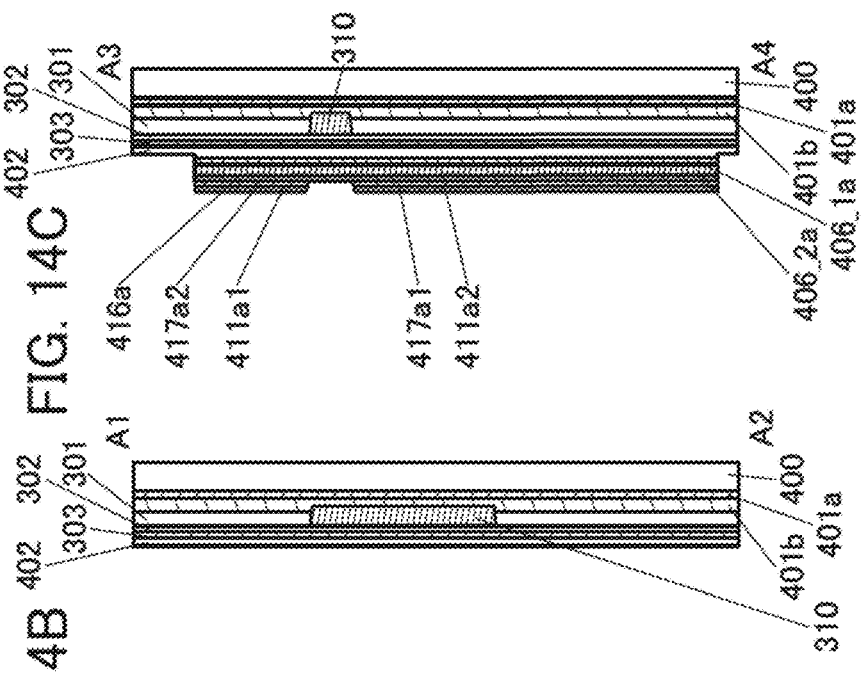
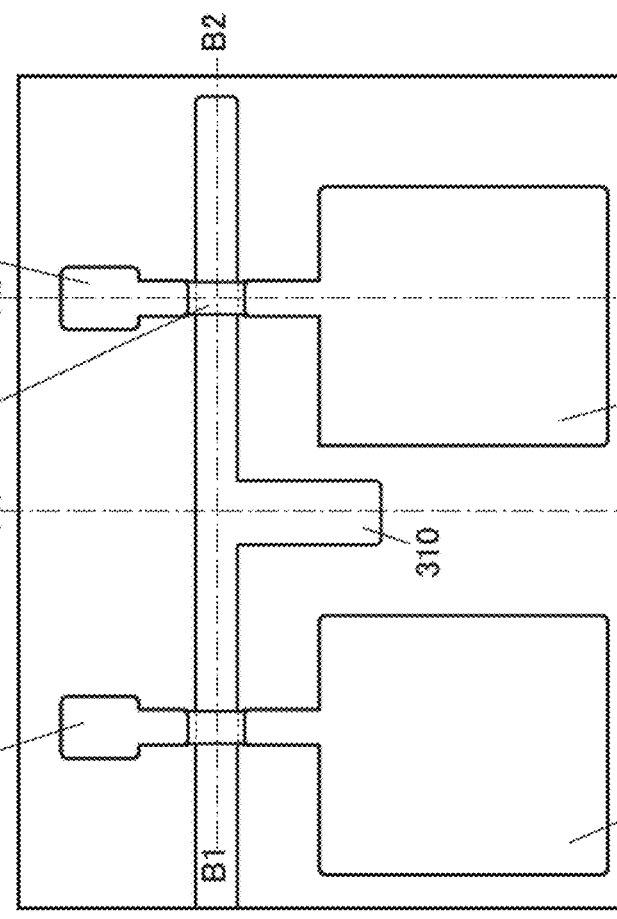
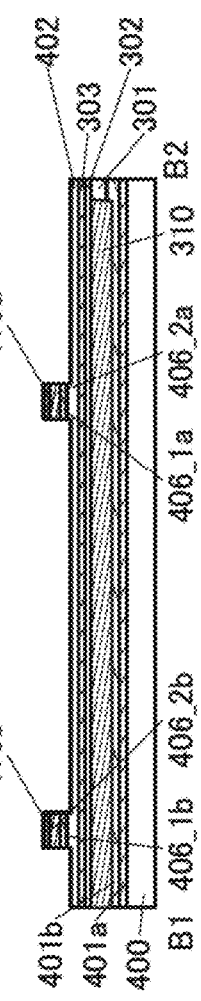

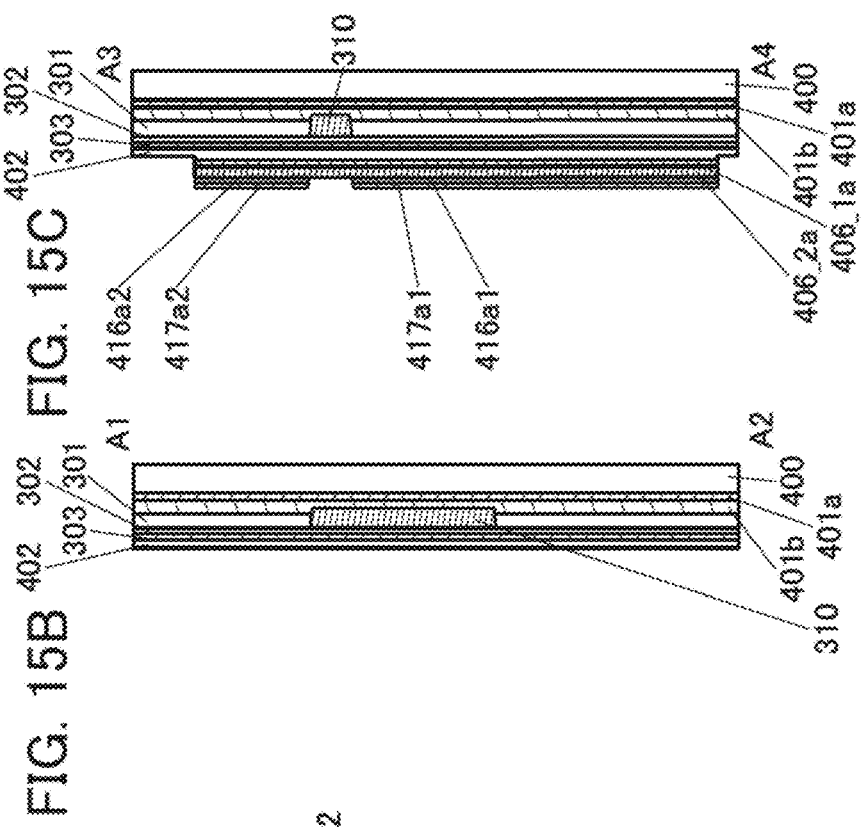
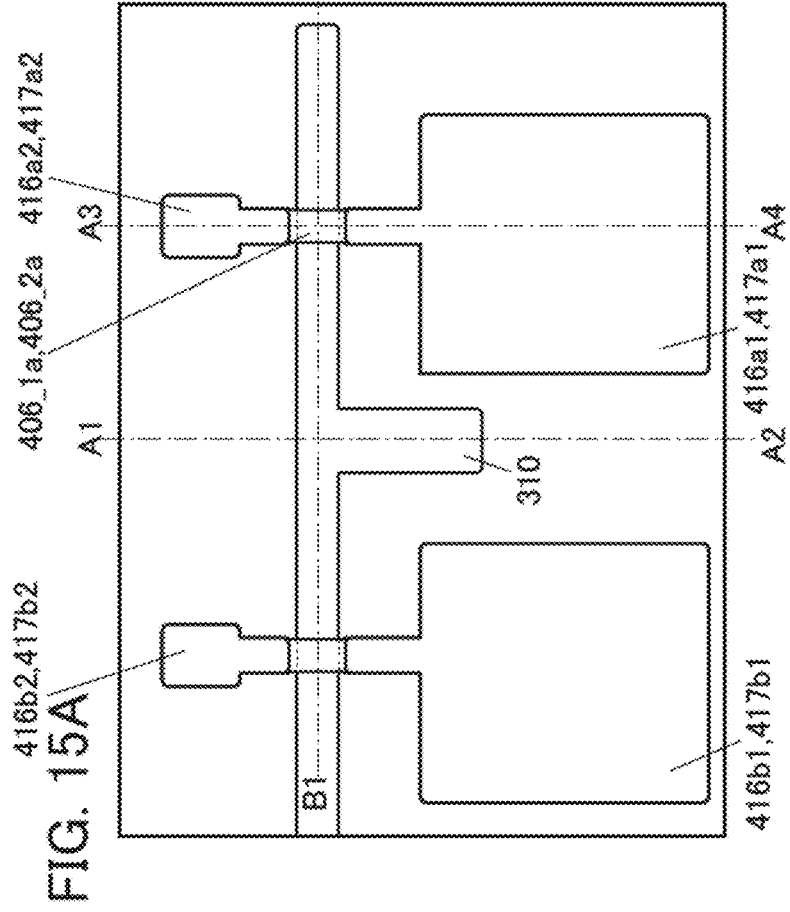
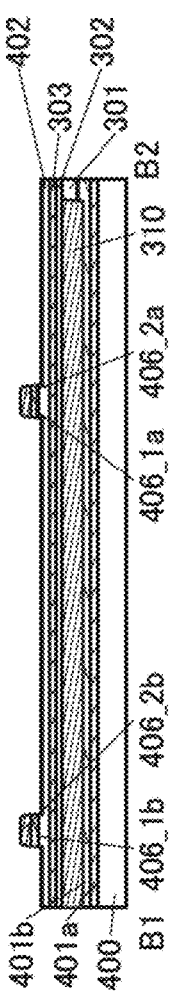

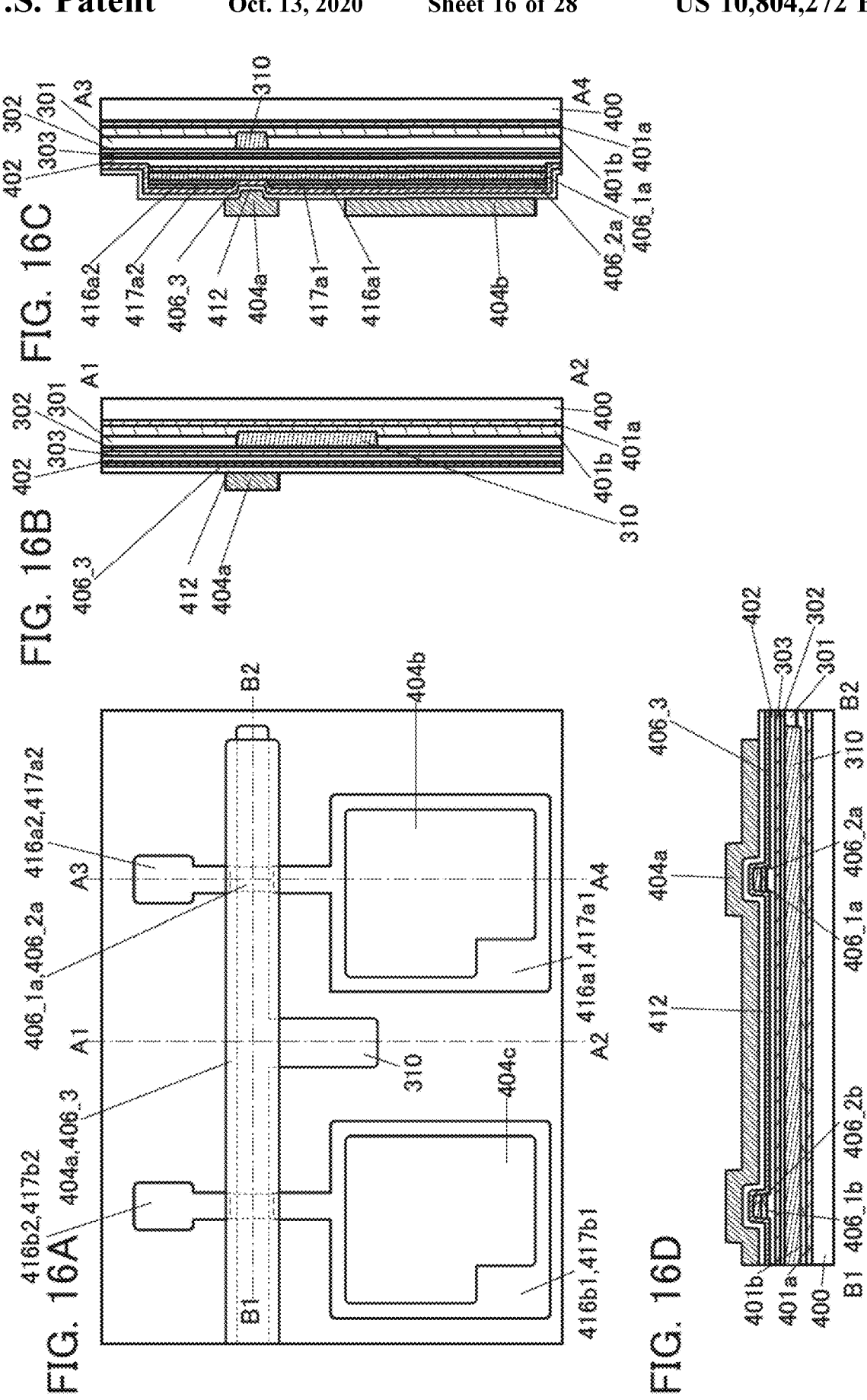

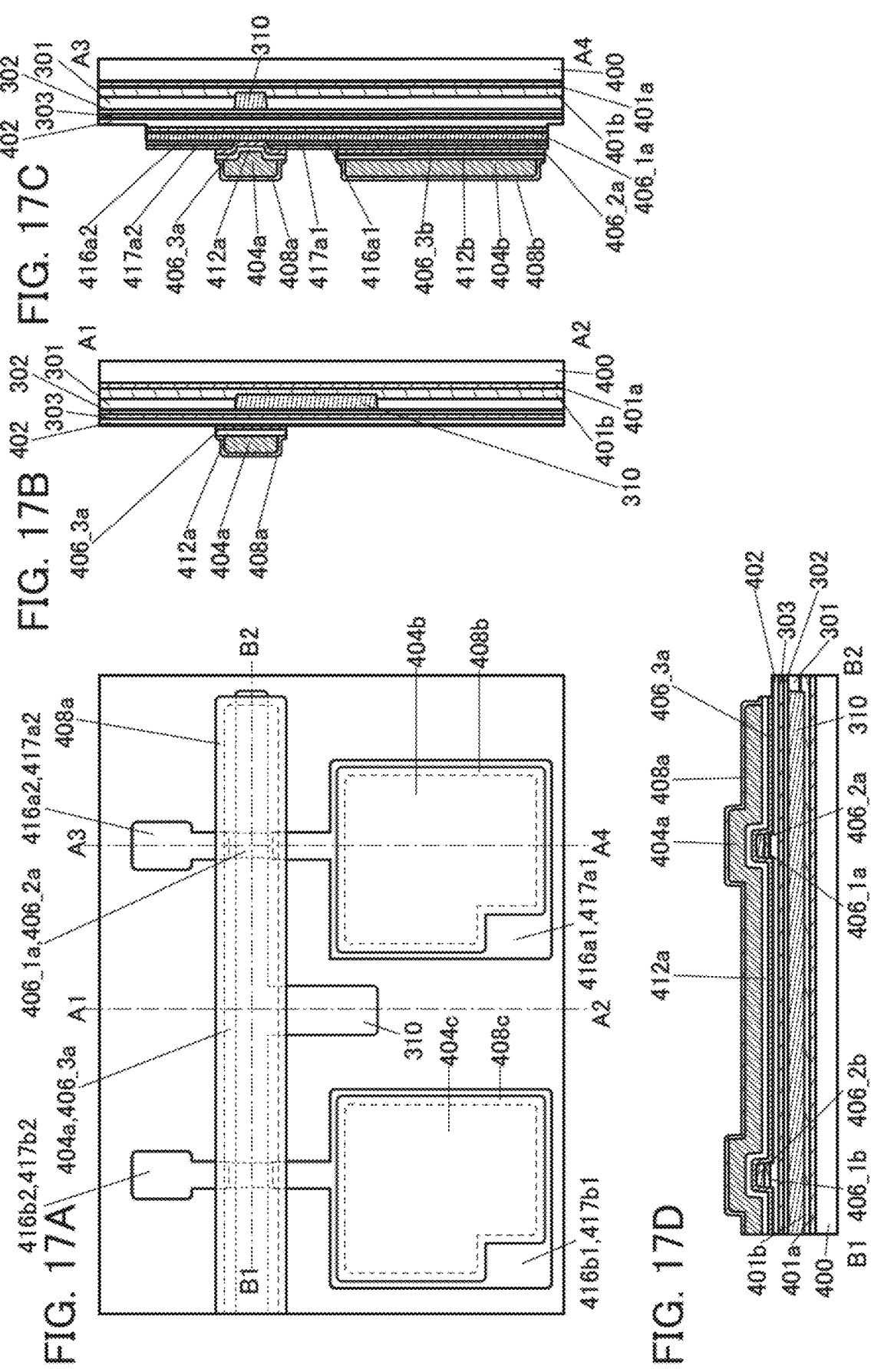

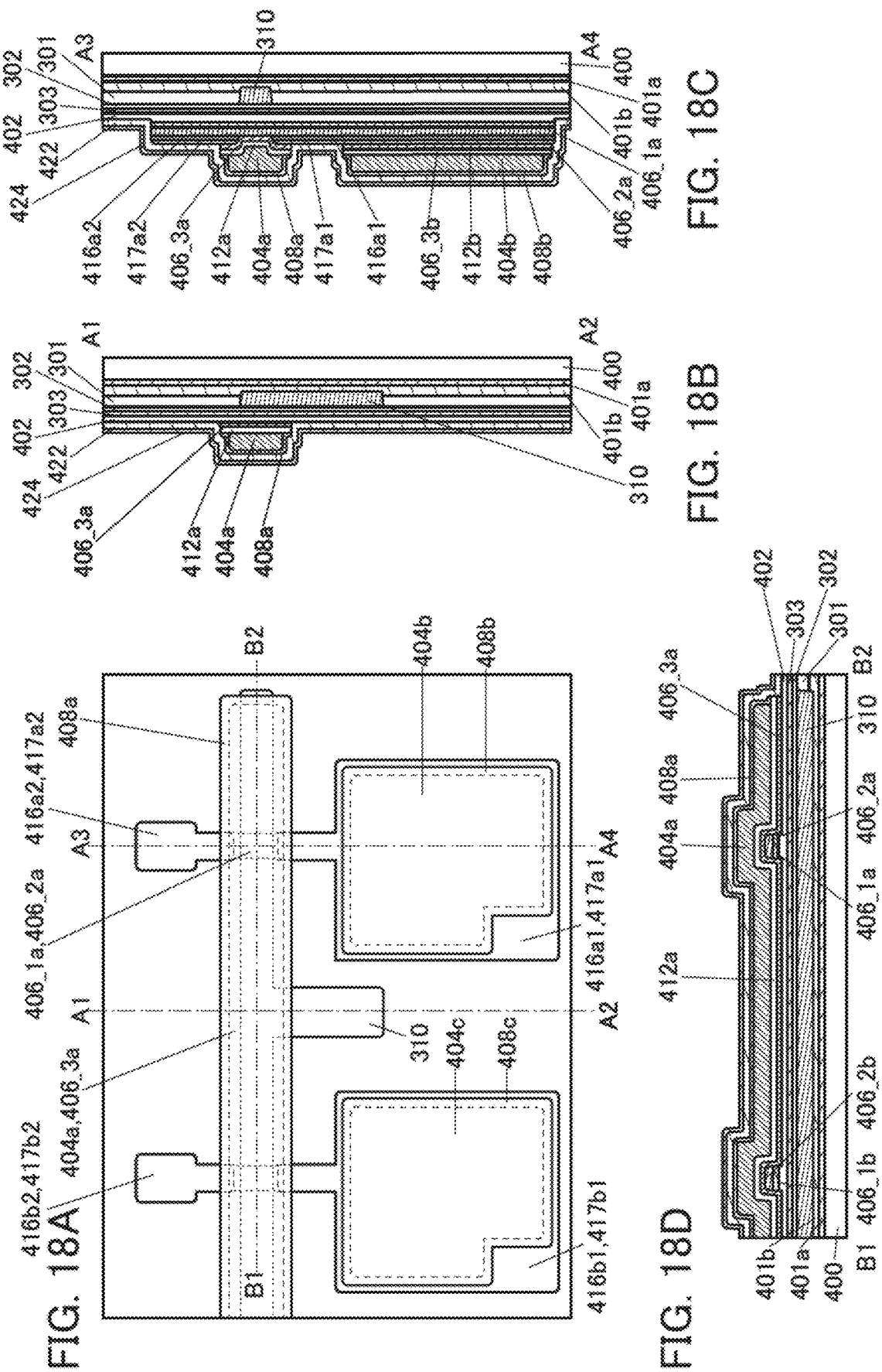

SEMICONDUCTOR DEVICE

BACKGROUND OF THE INVENTION

1. Field of the Invention

Embodiments of the present invention relate to a semiconductor device, and a method for driving the semiconductor device. Another embodiment of the present invention relates to an electronic device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

In this specification and the like, a semiconductor device refers to every device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

2. Description of the Related Art

A technique by which a transistor is formed using a semiconductor thin film has been attracting attention. The transistor is used in a wide range of electronic devices such as an integrated circuit (IC) and an image display device (also simply referred to as a display device). Silicon-based semiconductor materials are widely known as materials for semiconductor thin films that can be used for transistors. As other materials, oxide semiconductors have been attracting attention.

For example, techniques have been disclosed by each of which a display device is manufactured using a transistor whose active layer is formed of zinc oxide or an In—Ga—Zn-based oxide as an oxide semiconductor (see Patent Documents 1 and 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

However, it is known that a transistor including an oxide semiconductor as an active layer has a problem in that the electrical characteristics are likely to be changed by impurities and oxygen vacancies in the oxide semiconductor and thus the reliability is low. For example, the threshold voltage of the transistor might be changed after a bias-temperature stress test (BT test).

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

SUMMARY OF THE INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

According to one embodiment of the present invention, a leakage current path between adjacent memory cells in a memory cell array included in the semiconductor device is blocked without increasing the number of manufacturing steps, so that memory retention characteristics can be improved.

One embodiment of the present invention is a semiconductor device including a semiconductor substrate, a first memory cell over the semiconductor substrate including a first transistor and a first capacitor connected to one of a source electrode and a drain electrode of the first transistor, and a second memory cell over the semiconductor substrate including a second transistor and a second capacitor connected to one of a source electrode and a drain electrode of the second transistor. The first transistor includes a first oxide, a first gate electrode, a second gate electrode, a first gate insulator between the first oxide and the first gate electrode, a first conductor and a second conductor in contact with the first oxide, a second oxide in contact with the first oxide and located between the first gate insulator and the first oxide, and a second gate insulator between the first oxide and the second gate electrode. The second transistor includes a third oxide, the first gate electrode, the second gate electrode, a third gate insulator between the third oxide and the first gate electrode, a third conductor and a fourth conductor in contact with the third oxide, the second oxide in contact with the third oxide and located between the third gate insulator and the third oxide, and the second gate insulator between the third oxide and the second gate electrode. The second gate electrode includes a region overlapping with the second oxide and a region extending beyond a perimeter portion of the second oxide. The region extending beyond the perimeter portion of the second oxide is located between a connection region of the first transistor and the first capacitor and a connection region of the second transistor and the second capacitor.

One embodiment of the present invention is the semiconductor device including a termination portion of the second gate electrode including a region extending beyond a termination portion of the second oxide.

One embodiment of the present invention is the semiconductor device including the first conductor located over the first oxide, and the second conductor located over the first oxide.

One embodiment of the present invention is the semiconductor device including the first oxide and the third oxide functioning as a channel and the first conductor, the second conductor, the third conductor, and the fourth conductor functioning as a source electrode or a drain electrode.

One embodiment of the present invention is the semiconductor device including the first to third oxides including an oxide semiconductor.

A semiconductor device having favorable electric characteristics can be provided. A semiconductor device that can be miniaturized or highly integrated can be provided. A semiconductor device with high productivity can be provided.

A semiconductor device capable of retaining data for a long time can be provided. A semiconductor device capable of high-speed data writing can be provided. A semiconductor device with high design flexibility can be provided. A low-power semiconductor device can be provided. Alternatively, a novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

In the accompanying drawings:

FIGS. 1A to 1D are a top view and cross-sectional views illustrating the structure of a semiconductor device of one embodiment of the present invention;

FIGS. 2A to 2D are a top view and cross-sectional views illustrating the structure of a semiconductor device of one embodiment of the present invention;

FIGS. 3A to 3D are a top view and cross-sectional views illustrating the structure of a semiconductor device of one embodiment of the present invention;

FIGS. 11A to 11D are a top view and cross-sectional views illustrating a method for manufacturing a semiconductor device of one embodiment of the present invention;

FIGS. 12A to 12D are a top view and cross-sectional views illustrating a method for manufacturing a semiconductor device of one embodiment of the present invention;

FIGS. 13A to 13D are a top view and cross-sectional views illustrating a method for manufacturing a semiconductor device of one embodiment of the present invention;

FIGS. 14A to 14D are a top view and cross-sectional views illustrating a method for manufacturing a semiconductor device of one embodiment of the present invention;

FIGS. 15A to 15D are a top view and cross-sectional views illustrating a method for manufacturing a semiconductor device of one embodiment of the present invention;

FIGS. 16A to 16D are a top view and cross-sectional views illustrating a method for manufacturing a semiconductor device of one embodiment of the present invention;

FIGS. 17A to 17D are a top view and cross-sectional views illustrating a method for manufacturing a semiconductor device of one embodiment of the present invention;

FIGS. 18A to 18D are a top view and cross-sectional views illustrating a method for manufacturing a semiconductor device of one embodiment of the present invention;

DETAILED DESCRIPTION OF THE INVENTION

Figure 4A:
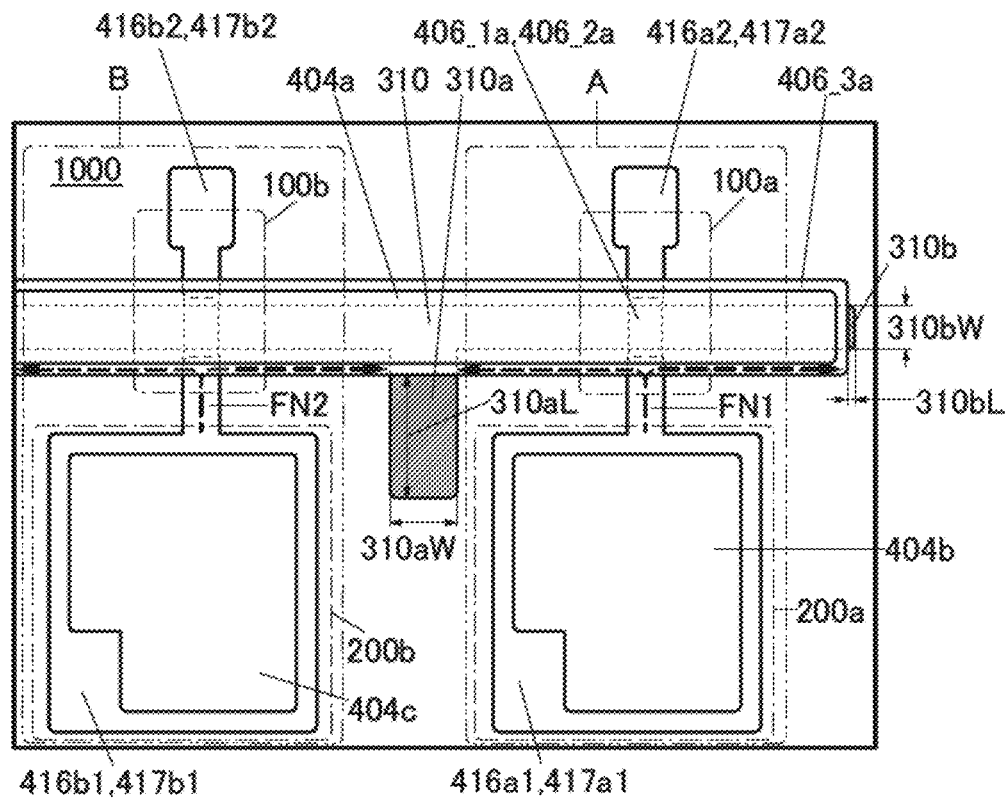
FIGS. 4A and 4B illustrate a leakage path of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. In addition, the same hatching pattern is applied to portions having similar functions, and the portions are not particularly denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relation between components is changed as appropriate in accordance with the direction in which each component is described. Thus, there is no limitation on terms used in this specification, and description can be made appropriately depending on the situation.

The "semiconductor device" in this specification and the like means every device which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell and the like), and an electronic device may each include a semiconductor device.

In this specification and the like, a transistor is an element having at least three terminals of a gate, a drain, and a source. In addition the transistor has a channel region between a drain (a drain terminal, a drain region, or a drain electrode) and a source (a source terminal, a source region, or a source electrode), and current can flow between the source and the drain through the channel formation region. Note that in this specification and the like, a channel region refers to a region through which current mainly flows.

Furthermore, the functions of a source and a drain might be interchanged with each other when transistors having different polarities are employed or the direction of current flow is changed in circuit operation, for example. Therefore, the terms "source" and "drain" can be interchanged with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, transistors described in this specification and the like are enhancement-type (normally-off-type) field effect transistors. Unless otherwise specified, a transistor described in this specification and the like refers to an n-channel transistor. Thus, unless otherwise specified, the threshold voltage (also referred to as "Vth") is larger than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relation, for example, the connection relation shown in drawings or texts, another connection relation is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit and a step-down circuit) and a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit, a signal generation circuit; a memory circuit, and a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X. Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

(Embodiment 1)

<Semiconductor Device Structure 1>

Figure 8:
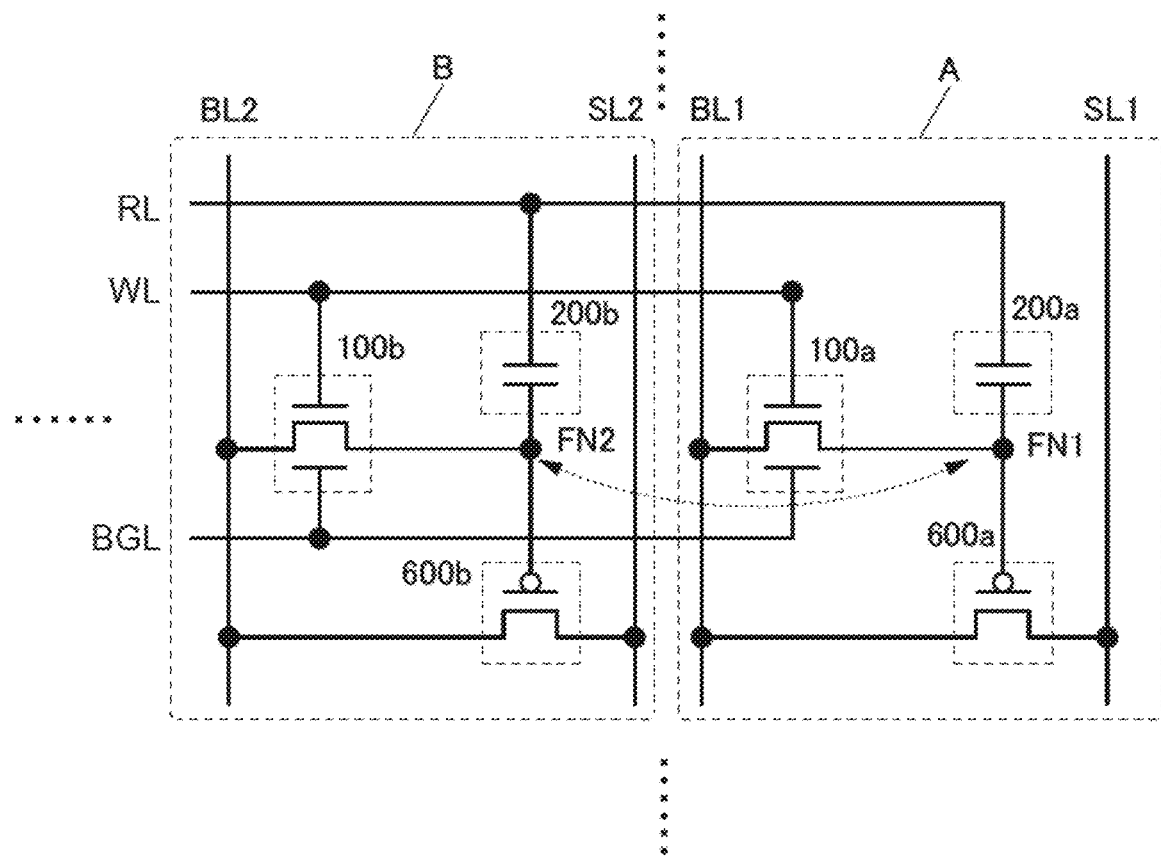
FIG. 8 is a circuit diagram of a semiconductor device of one embodiment of the present invention.
Figure 9C:
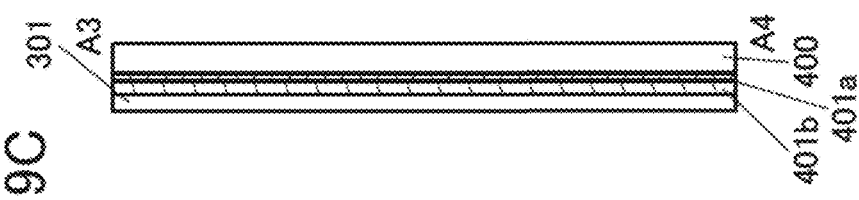
FIGS. 9A to 9D are a top view and cross-sectional views illustrating a method for manufacturing a semiconductor device of one embodiment of the present invention.
Figure 9B:
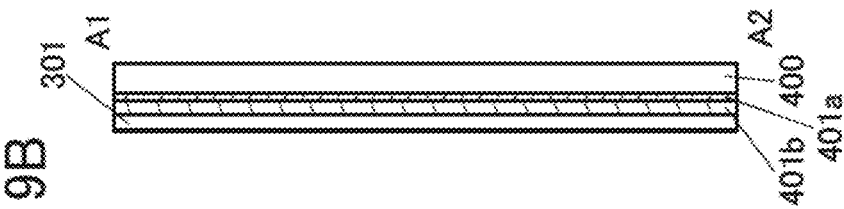
Figure 9A:
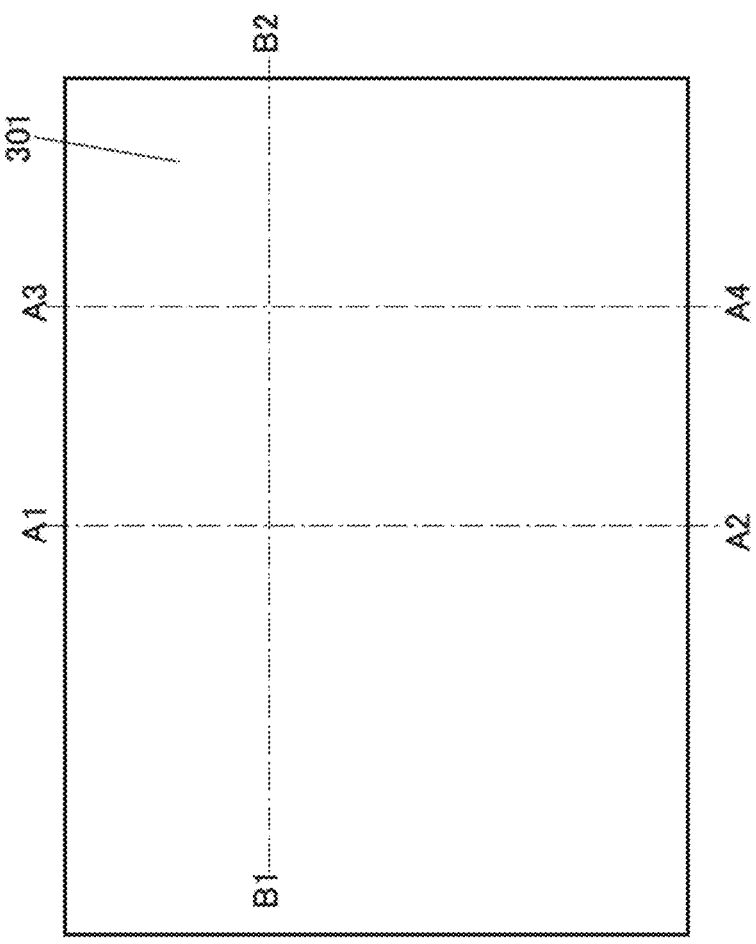
Figure 9D:
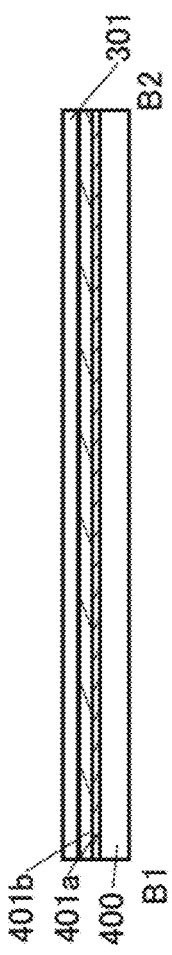
Figure 10C:
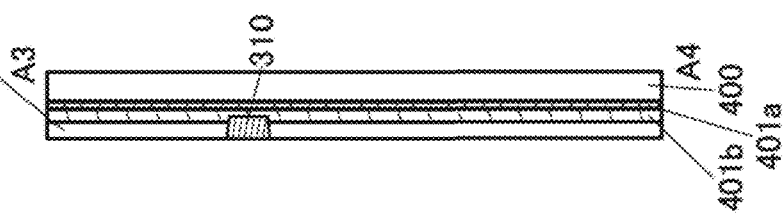
FIGS. 10A to 10D are a top view and cross-sectional views illustrating a method for manufacturing a semiconductor device of one embodiment of the present invention.
Figure 10B:
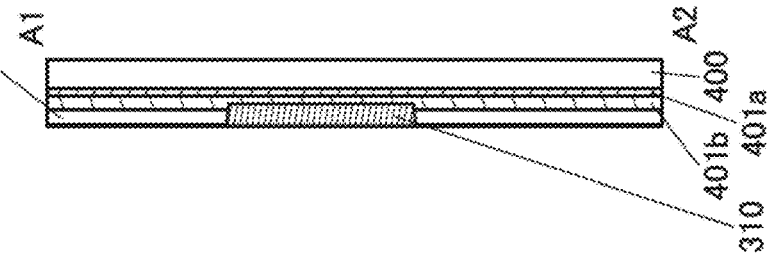
Figure 10A:
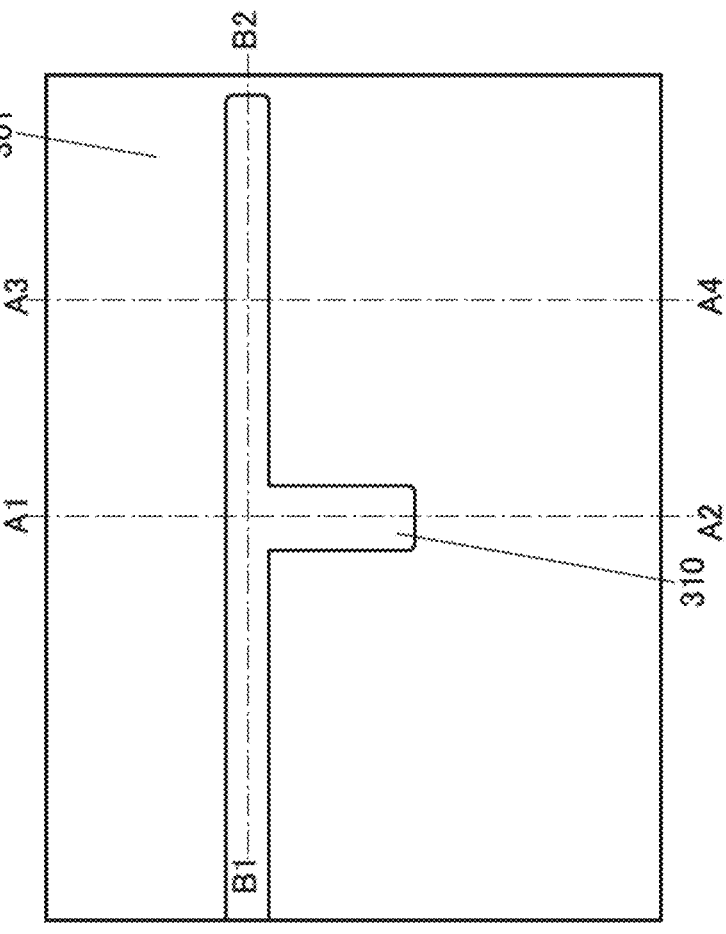
Figure 10D:
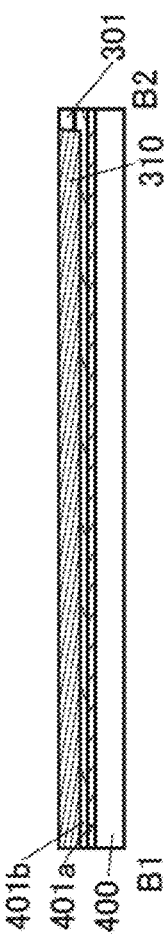

FIG. 8 is a circuit diagram illustrating part of a memory cell array included in a semiconductor device 1000. FIG. 8 illustrates a circuit diagram of two memory cells, a memory cell A and a memory cell B, and the memory cell A is a memory cell at a right end of the memory cell array. The memory cell included in the semiconductor device 1000 are repeatedly provided in the upper, lower, and left directions (denoted by dotted lines in FIG. 8).

The memory cell A includes a transistor 100*a* including a first gate electrode and a second gate electrode, a transistor 600*a*, a capacitor 200*a*, and a node FN1. Furthermore, the memory cell B includes a transistor 100*b* including a first gate electrode and a second gate electrode, a transistor 600*b*, a capacitor 200*b*, and a node FN2. The connection region of one of a source electrode and a drain electrode of the transistor 100*a* and one electrode of the capacitor 200*a* can be referred to as the node FN1. Furthermore, the connection region of one of a source electrode and a drain electrode of the transistor 100*b* and one electrode of the capacitor 200*b* can be referred to as the node FN2.

In the memory cell A, the first gate electrode of the transistor 100*a* is electrically connected to a wiring WL; the second gate electrode of the transistor 100*a* is electrically connected to a wiring BGL; the other of a source electrode and a drain electrode of the transistor 100*a* is electrically connected to a wiring BL1; and one of the source electrode and the drain electrode of the transistor 100*a* is electrically connected to the node FN1. The other electrode of the capacitor 200*a* is electrically connected to a wiring RL and one electrode of the capacitor 200*a* is electrically connected to the node FN1. A gate electrode of the transistor 600*a* is electrically connected to the node FN1; one of a source electrode and a drain electrode of the transistor 600*a* is electrically connected to the wiring BL1; and the other of the source electrode and the drain electrode of the transistor 600a is electrically connected to a wiring SL1.

In the memory cell B, the first gate electrode of the transistor 100b is electrically connected to the wiring WL; the second gate electrode of the transistor 100b is electrically connected to the wiring BGL; the other of a source electrode and a drain electrode of the transistor 100b is electrically connected to the wiring BL2; and one of the source electrode and the drain electrode of the transistor 100b is electrically connected to the node FN2. The other electrode of the capacitor 200b is electrically connected to the wiring RL and one electrode of the capacitor 200b is electrically connected to the node FN2. A gate electrode of the transistor 600b is electrically connected to the node FN2; one of a source electrode and a drain electrode of the transistor 600b is electrically connected to the wiring BL2; and the other of the source electrode and the drain electrode of the transistor 600b is electrically connected to a wiring SL2.

The first gate electrode of the transistor 100a of the memory cell A and the first gate electrode of the transistor 100b of the adjacent memory cell B are both electrically connected to the wiring WL. Furthermore, the second gate electrode of the transistor 100a of the memory cell A and the second gate electrode of the transistor 100b of the adjacent memory cell B are both electrically connected to the wiring BGL. Furthermore, the other electrode of the capacitor 200a of the memory cell A and the other electrode of the capacitor 200b of the adjacent memory cell B are both electrically connected to the wiring RL.

The transistors 100a and 100b preferably have low off-state current. For example, the off-state current of the transistors 100a and 100b is preferably lower than or equal to $10^{-18}$ A/µm, more preferably lower than or equal to $10^{-21}$ A/µm, still more preferably lower than or equal to $10^{-24}$ A/µm. An oxide semiconductor transistor can be used as a transistor having low off-state current.

The transistors 600a and 600b preferably have little variation in the threshold voltage. Specifically, a transistor including single crystal silicon in its channel is preferably used.

The memory cells A and B utilize a characteristic in which electric charge of the nodes FN1 and FN2 can be retained, so that data can be written, retained, and read as follows.

Data writing and data retention are described using the memory cell A. First, a potential is supplied to the wiring WL so that the transistor 100a is turned on. Accordingly, the potential of the wiring BL1 is supplied to the node FN1. In other words, predetermined electric charge is supplied to the node FN1 (data writing). Here, electric charge for applying either of two different potential levels (hereinafter referred to as a Low level and a High level) is given. After that, the transistor 100a is turned off, so that electric charge supplied to the node FN1 is retained (storing).

Since the off-state current of the transistor 100a is extremely low, electric charge of the gate of the transistor 600a is retained for a long time. Here, when a negative potential is supplied to the second gate electrode of the transistor 100a through the wiring BGL, the threshold value of the transistor 100a shifts in a positive direction, so that the off-state current of the transistor 100a can be further reduced.

Next, reading of data is described. An appropriate potential (reading potential) is applied to the wiring RL while a predetermined potential (constant potential) is applied to the wiring SL1, so that the potential of the wiring BL1 varies depending on the amount of electric charge retained in the gate of the transistor 600a. This is because in the case where the transistor 600a is a p-channel transistor, apparent threshold voltage $V_{th\_H}$ when a High level is supplied to the node FN1 is usually lower than apparent threshold voltage $V_{th\_L}$ when a Low level is supplied to the node FN1. Here, the apparent threshold voltage refers to the potential of the wiring RL that is needed to turn on the transistor 600a. Thus, when the potential of the wiring RL is set to a potential $V_0$ that is between $V_{th\_H}$ and $V_{th\_L}$, electric charge given to the gate of the transistor 600a can be determined. For example, in the case where the Low level is supplied in data writing, the transistor 600a is turned on when the potential of the node FN1 is $V_0$ ($<V_{th\_L}$). In the case where the High level is supplied in data writing, the transistor 600a remains in an off state even when the potential of the node FN1 is set to $V_0$ ($>V_{th\_H}$). Therefore, the retained data can be read by determining the potential of the wiring BL1.

Note that although the transistor 600a is a p-channel transistor in the above description, one embodiment of the present invention is not limited thereto, and the transistor 600a might be an n-channel transistor.

FIGS. 1A to 1D shows a top view and cross-sectional views of the memory cells A and B included in the semiconductor device 1000 illustrated in FIG. 8. The transistors 600a and 600b illustrated in FIG. 8 are omitted in FIGS. 1A to 1D.

FIG. 1A is a top view of the memory cells A and B which are part of the memory cell array included in the semiconductor device 1000. FIG. 1B is a cross-sectional view taken along dashed-dotted line A1-A2 in FIG. 1A. FIG. 1C is a cross-sectional view taken along dashed-dotted line A3-A4 in FIG. 1A. FIG. 1D is a cross-sectional view taken along dashed-dotted line B1-B2 in FIG. 1A. For clarity of the drawing, some components in the top view of FIG. 1A are not illustrated. The memory cell A includes the transistor 100a, the capacitor 200a, and the node FN1. The memory cell B includes the transistor 100b, the capacitor 200b, and the node FN2. Furthermore, the memory cell A indicates the memory cell at the right end of the memory cell array included in the semiconductor device 1000.

The memory cells A and B include an insulator 401a over a substrate 400, an insulator 401b over the insulator 401a, and the transistors 100a and 100b, the capacitors 200a and 200b, and the nodes FN1 and FN2 over the insulator 401b. An insulator 408a, an insulator 408b, an insulator 408c, an insulator 422, an insulator 424, an insulator 410, an insulator 415, and an insulator 418 are located over the transistors 100a and 100b, the capacitors 200a and 200b, and the nodes FN1 and FN2.

The transistor 100a includes an insulator 301 having an opening in which a conductor 310 is provided, an insulator 302 over the conductor 310 and the insulator 301, an insulator 303 over the insulator 302, an insulator 402 over the insulator 303, an oxide 406_1a over the insulator 402, an oxide 406_2a over the oxide 406_1a, a conductor 416a1 and a conductor 416a2 each including a region in contact with a top surface of the oxide 406_2a; an oxide 406_3a including a region in contact with a side surface of the conductor 416a1; a side surface of the conductor 416a2; and the top surface of the oxide 406_2a; an insulator 412a over the oxide 406_3a; and a conductor 404a including a region overlapping with the oxide 406_3a with the insulator 412a provided therebetween. Furthermore, a barrier film 417a1 and a barrier film 417a2 are provided over the transistor 100a.

The transistor 100b includes the insulator 301 having the opening in which the conductor 310 is provided, the insulator 302 over the conductor 310 and the insulator 301, the insulator 303 over the insulator 302, the insulator 402 over the insulator 303, an oxide 406_1*b* over the insulator 402, an oxide 406_2*b* over the oxide 406_1*b*, a conductor 416*b*1 and a conductor 416*b*2 each including a region in contact with a top surface of the oxide 406_2*b*; the oxide 406_3*a* including a region in contact with a side surface of the conductor 416*b*1; a side surface of the conductor 416*b*2; and the top surface of the oxide 406_2*b*; the insulator 412*a* over the oxide 406_3*a*; and the conductor 404*a* including a region overlapping with the oxide 406_3*a* with the insulator 412*a* provided therebetween. Furthermore, a barrier film 417*b*1 and a barrier film 417*b*2 are provided over the transistor 100*b*.

The conductor 404*a*, the insulator 412*a*, the oxide 406_3*a*, the conductor 310, and the insulators 302, 303, and 402 are provided in common in the transistor 100*a* and the transistor 100*b*.

The capacitor 200*a* includes the conductor 416*a*1, the barrier film 417*a*1 over the conductor 416*a*1, an oxide 406_3*b* over the barrier film 417*a*1, an insulator 412*b* over the oxide 406_3*b*, and a conductor 404*b* including a region overlapping with the conductor 416*a*1 with the barrier film 417*a*1, the oxide 406_3*b*, and the insulator 412*b* provided therebetween.

The capacitor 200*b* includes the conductor 416*b*1, the barrier film 41761 over the conductor 416*b*1, an oxide 406_3*c* over the barrier film 417*b*1, an insulator 412*c* over the oxide 406_3*c*, and a conductor 404*c* including a region overlapping with the conductor 416*b*1 with the barrier film 417*b*1, the oxide 406_3*c*, and the insulator 412*c* provided therebetween.

The conductor 416*a*1 serves as the source electrode or the drain electrode of the transistor 100*a* and also serves as one electrode of the capacitor 200*a*. In other words, the transistor 100*a* is electrically connected to the capacitor 200*a* through the conductor 416*a*1. The region where the transistor 100*a* is electrically connected to the capacitor 200*a* can be referred to as the node FN1.

Alternatively the conductor 416*b*1 serves as the source electrode or the drain electrode of the transistor 100*b* and also serves as one electrode of the capacitor 200*b*. In other words, the transistor 100*b* is electrically connected to the capacitor 200*b* through the conductor 416*b* 1. The region where the transistor 100*b* is electrically connected to the capacitor 200*b* can be referred to as the node FN2.

The conductor 404*a* serves as the first gate electrode of the transistor 100*a*. Furthermore, the conductor 404*a* can have a stacked structure including a conductor having a function of inhibiting penetration of oxygen. For example, when the conductor having a function of inhibiting penetration of oxygen is formed as a lower layer, an increase in the electric resistivity due to oxidation of the conductor 404*a* can be prevented. The insulator 412*a* serves as a first gate insulator.

The conductors 416*a*1 and 416*a*2 function as source and drain electrodes of the transistor. The conductors 416*a*1 and 416*a*2 each can have a stacked structure including a conductor that has a function of inhibiting penetration of oxygen. For example, when the conductor that has a function of inhibiting penetration of oxygen is formed as an upper layer, an increase in the electric resistance value due to oxidation of the conductors 416*a*1 and 416*a*2 can be prevented. Note that the electric resistance values of the conductors can be measured by a two-terminal method or the like.

The barrier films 417*a*1 and 417*a*2 each have a function of inhibiting the passage of oxygen and impurities such as hydrogen and water. The barrier film 417*a*1 is located over the conductor 416*a*1 and prevents the diffusion of oxygen into the conductor 416*a*1. The barrier film 417*a*2 is located over the conductor 416*a*2 and prevents the diffusion of oxygen into the conductor 416*a*2.

In the transistor 100*a*, the resistance of the oxide 406_2*a* can be controlled by a potential applied to the conductor 404*a*. That is, conduction or non-conduction between the conductors 416*a*1 and 416*a*2 can be controlled by the potential applied to the conductor 404*a*.

As illustrated in FIGS. 1C and 1D, the top surface of the oxide 406_2*a* is in contact with the conductors 416*a*1 and 416*a*2. The oxides 406_1*a* and 406_2*a* can be electrically surrounded by an electric field of the conductor 404*a* functioning as the first gate electrode. A structure in which the electric field of the first gate electrode electrically surrounds a semiconductor is referred to as a surrounded channel (s-channel) structure. Therefore, a channel is formed in the entire oxide 406_2*a* in some cases. In the s-channel structure, a large amount of current can flow between a source and a drain of the transistor, so that an on-state current can be increased. In addition, since the oxides 406_1*a* and 406_2*a* are electrically surrounded by the electric field of the conductor 404*a*, an off-state current can be reduced.

In the transistor 100*a*, the conductor 404*a* functioning as the first gate electrode partly overlaps with each of the conductors 416*a*1 and 416*a*2 functioning as a source electrode and a drain electrode, whereby parasitic capacitance between the conductor 404*a* and the conductor 416*a*1 and parasitic capacitance between the conductor 404*a* and the conductor 416*a*2 are formed.

Since the transistor 100*a* includes the barrier film 417*a*1 as well as the insulator 412*a* and the oxide 406_3*a* between the conductor 404*a* and the conductor 416*a*1, the parasitic capacitance can be reduced. Similarly, since the transistor 100*a* includes the barrier film 417*a*2 as well as the insulator 412*a* and the oxide 406_3*a* between the conductor 404*a* and the conductor 416*a*2, the parasitic capacitance can be reduced. Thus, the transistor 100*a* has excellent frequency characteristics.

Furthermore, the above structure of the transistor 100*a* allows a reduction or prevention of generation of a leakage current between the conductor 404*a* and each of the conductors 416*a*1 and 416*a*2 when the transistor 100*a* operates, for example, when a potential difference is generated between the conductor 404*a* and each of the conductors 416*a*1 and 416*a*2.

The conductor 310 functions as a second gate electrode. The conductor 310 can be a multilayer film including a conductor that has a fiction of inhibiting the passage of oxygen. The use of the multilayer film including a conductor that has a function of inhibiting penetration of oxygen can prevent a decrease in conductivity due to oxidation of the conductor 310.

The insulator 302, the insulator 303, and the insulator 402 function as a second gate insulating film. The potential applied to the conductor 310 can control the threshold voltage of the transistor 100*a*.

The description of the transistor 100*a* can be referred to for the function of the transistor 100*b*. The conductor 404*a* serving as the first gate electrode, the insulator 412*a* serving as the first gate insulator, the conductor 310 serving as the second gate electrode, and the insulators 302, 303, and 402 serving as the second gate insulator are provided in common in the transistors 100*a* and 100*b*.

The capacitor 200*a* includes the conductor 416*a*1 serving as one electrode and the conductor 404*b* serving as the other electrode. Note that the conductor 416*a*1 also serves as the source electrode or the drain electrode of the transistor 100*a*.

The capacitor 200*b* includes the conductor 416*b*1 serving as one electrode and the conductor 404*c* serving as the other electrode. Note that the conductor 416*b*1 also serves as the source electrode or the drain electrode of the transistor 100*b*.

Figure 4B:
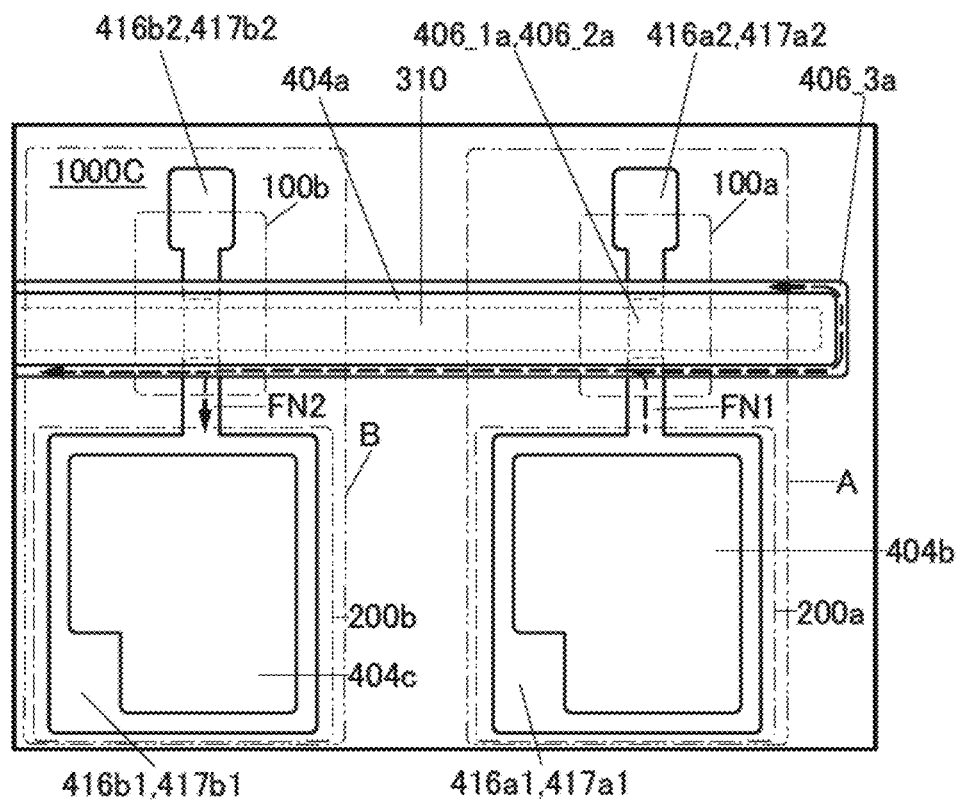

Here, an arrangement of the conductor 310 and the oxide 406_3*a* when seen from above of one embodiment of the present invention will be described with reference to FIGS. 4A and 4B. In FIGS. 4A and 4B, some components are omitted for clarity. FIG. 4A is a top view of the semiconductor device 1000 illustrated in FIG. 1A. FIG. 4B is a top view of the semiconductor device 1000C. As shown in FIG. 4A, the conductor 310 includes a region 310*a* extending beyond the perimeter portion of the oxide 406_3*a* between the nodes FN1 and FN2, and the conductor 310 also includes a region 310*b* extending beyond the termination portion of the oxide 406_3*a* in the right end portion of the memory cell A in the channel width direction of the transistors 100*a* and 100*b*, in other words, in the termination portion of the conductor 310 and the oxide 406_3*a*.

The memory cell A is the memory cell in the right end portion in the memory cell array, thus, a memory cell is not arranged on the right side of the memory cell A. This, the end portion of the right side of the transistor 100*a* in the channel width direction included in the memory cell A is referred to as the termination portion. A hatching is provided to clarify the extended regions 310*a* and 310*b* in FIG. 4A. Meanwhile, in the semiconductor device 1000C shown in FIG. 4B, the conductor 310 does not include a region extending beyond the oxide 406_3*a* and the end portion of the oxide 406_3*a* is arranged on the outer side of the end portion of the conductor 310.

Figure 7A:
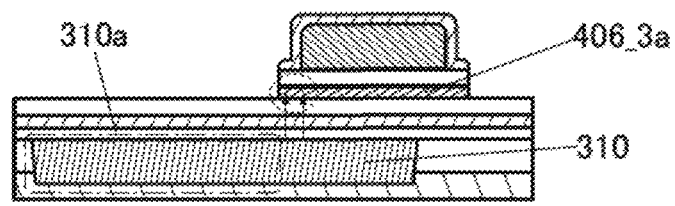
FIGS. 7A to 7D each illustrate a cross-sectional structure of a semiconductor device of one embodiment of the present invention.
Figure 7B:
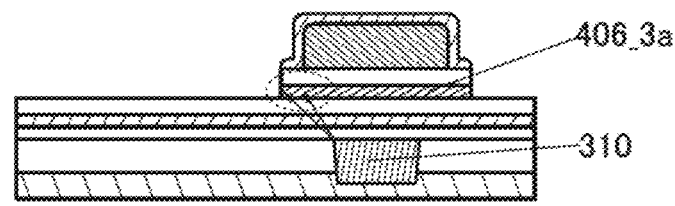
Figure 7C:
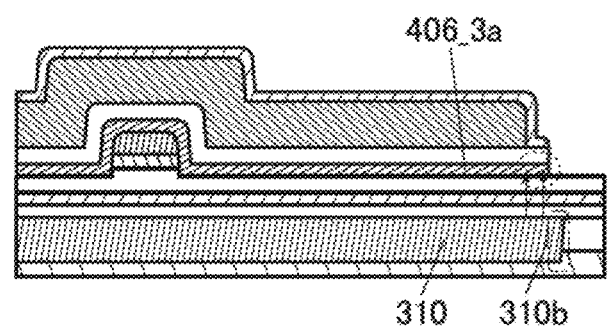
Figure 7D:
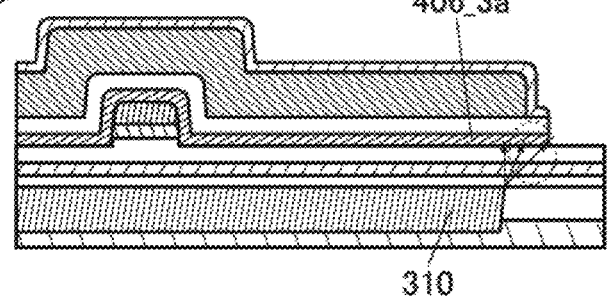

Cross-sectional views of vicinities of the regions 310*a* and 310*b* are shown in FIGS. 7A to 7D. FIG. 7A is a cross-sectional view of a vicinity of the region 310*a* of the semiconductor device 1000. FIG. 7B is a cross-sectional view of a vicinity corresponding to the region 310*a* in the semiconductor device 1000C. FIG. 7C is a cross-sectional view of a vicinity of the region 310*b* of the semiconductor device 1000. FIG. 7D is a cross-sectional view of a vicinity corresponding to the region 310*b* of the semiconductor device 1000C. Note that some components are omitted for simplification in FIGS. 7A to 7D.

In FIGS. 7A to 7D, the direction of the electric field between the conductor 310 and a vicinity of the end portion of the oxide 406_3*a* is denoted by arrows. In FIGS. 7A and 7C, the shortest distance of the electric field applied between the conductor 310 and the vicinity of the end portion of the oxide 406_3*a* is the total film thickness of the insulators 301, 302, and 303. Meanwhile, in FIGS. 7B and 7D, the shortest distance of the electric field applied between the conductor 310 and the vicinity of the end portion of the oxide 406_3*a* is longer than that in FIGS. 7A and 7C since the electric field is in a diagonal direction. It is apparent that the electric field from the conductor 310 does not sufficiently reach the perimeter portion of the oxide 406_3*a* in the arrangement of the semiconductor device 1000C since the electric field intensity decreases inversely proportional to the square of the distance. Thus, with an arrangement including the region 310*a* and the region 310*b* of one embodiment of the present invention, an electric field can be applied to part of the perimeter portion of the oxide 406_3. By applying a voltage which can block the leakage path between the nodes FN1 and FN2 to the conductor 310, the leakage path between the nodes FN1 and FN2 can be blocked.

Here, the operation for retaining electric charge in each of the memory cells A and B is described. First, a potential is supplied to the conductor 404*a* which serves as the first gate electrode of the transistors 100*a* and 100*b* so that the transistors 100*a* and 100*b* are turned on. Accordingly, the potential of the conductor 416*a*2 serving as the source electrode or the drain electrode is supplied to the node FN1 in the memory cell A. Moreover, the potential of the conductor 416*b*2 serving as the source electrode or the drain electrode is supplied to the node FN2 in the memory cell B. This, predetermined electric charge is supplied to the nodes FN1 and FN2. Here, among the two different potential levels, a High level is supplied to the node FN1 and a Low level is supplied to the node FN2. After that, the transistors 100*a* and 100*b* are turned off whereby electric charge supplied to the nodes FN1 and FN2 is retained.

At this time, when the negative potential is supplied to the conductor 310 serving as the second gate electrode of the transistors 100*a* and 100*b*, the threshold voltage of the transistors 100*a* and 100*b* shifts to a positive direction; thus, the off-state current of the transistors 100*a* and 100*b* can be further reduced. In such a manner, the off-state current of the transistors 100*a* and 100*b* can be made extremely low, thus, electric charge supplied to the nodes FN1 and FN2 can be retained for a long time.

In the case where the potentials of the nodes of each adjacent memory cells are different as in the above case where a High-level potential is retained in the node FN1 and a Low-level potential is retained in the node FN2 as described above, an extremely low current flows between the nodes through the oxide 406_3*a* connected between the adjacent memory cells in the structure of the semiconductor device 1000C; thus, electric charge in the nodes cannot be retained in some cases.

The case of the semiconductor device 1000C in FIG. 4B will be described. The node FN1 (High-level potential) and the node FN2 (Low-level potential) have a different stored potential; thus, an extremely low current flows between the nodes FN1 and FN2 through the oxide 406_3*a* (leakage current). In other words, electric charge retained in the node FN1 transfers to the node FN2 through the perimeter portion of the oxide 406_3*a*; thus, the potential of the node FN1 decreases and the potential of the node FN2 increases. That is, the potentials of the nodes FN1 and FN2 cannot be retained; thus, long memory retention time cannot be realized.

The perimeter portion of the oxide 406_3*a* is located on an outer side of the perimeter portion of the conductor 310 serving as the second gate electrode in the semiconductor device 1000C. The negative potential is supplied to the conductor 310 serving as the second gate electrode. A sufficient electric field due to the negative potential of the conductor 310 is supplied to the region where the conductor 310 and the oxide 406_3*a* overlap. However, the perimeter portion of the oxide 406_3*a* which is the region where the conductor 310 and the oxide 406_3*a* do not overlap becomes a leakage current path when the electric field due to the negative potential supplied to the conductor 310 decreases and becomes insufficient and thus a channel is formed in the perimeter portion of the oxide 406_3*a*. The leakage current path is indicated by a dotted arrow in FIG. 4B.

The problem of the leakage current path is solved by changing the arrangement of the conductor 310 serving as the second gate electrode and the oxide 406_3*a*. In order to block the leakage path, the oxide 4063a connected between the adjacent memory cells is arranged separately in each memory cell. In order to arrange the oxides 406_3a separately, a lithography process is necessary. The addition of the lithography process leads to a decrease in yield, an increase in manufacturing cost, and a decrease in productivity; thus, this is not preferable.

According to one embodiment of the present invention, the problem can be solved without adding the lithography process. Description is made with reference to FIG. 4A. In the semiconductor device 1000, the conductor 310 includes the region 310a extending beyond the oxide 406_3a between the nodes FN1 and FN2 and the region 310b extending beyond the termination portion of the oxide 406_3a in the termination portion of the memory cell A in the channel width direction of the transistors 100a and 100b. However, with two extending regions, the electric field due to the negative potential of the conductor 310 is sufficiently supplied to part of the perimeter portion of the oxide 406_3a, so that the formation of the channel is prevented and the leakage path can be blocked.

Figure 5A:
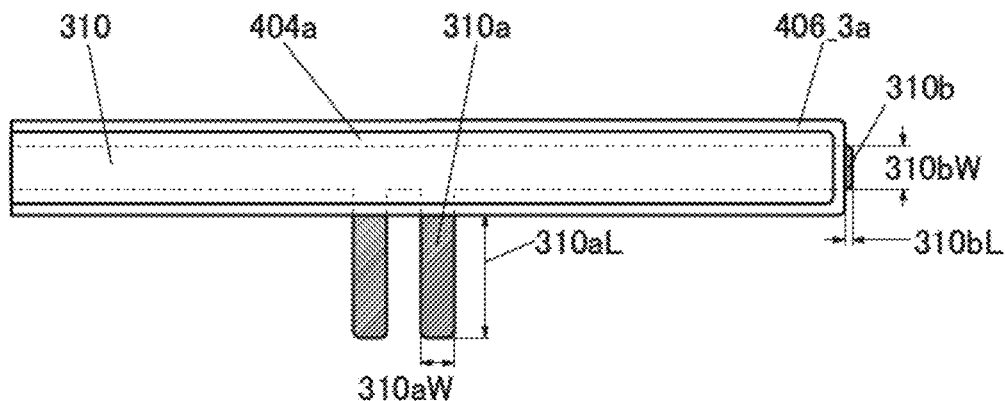
FIGS. 5A to 5C are top views each illustrating a semiconductor device of one embodiment of the present invention.
Figure 5B:
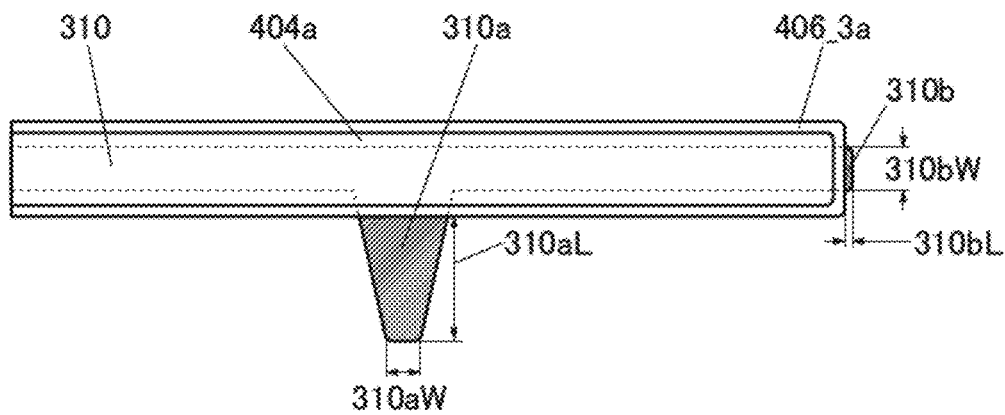
Figure 5C:
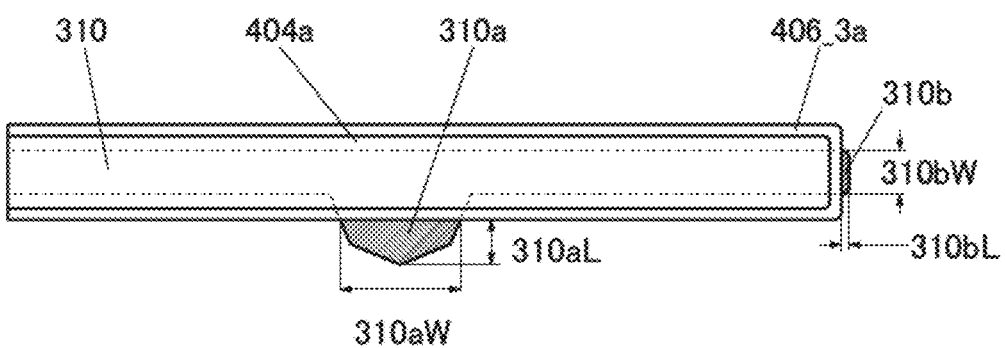

As described above, the leakage path between the nodes FN1 and FN2 can be blocked with the arrangement including the region 310a and the region 310b in the semiconductor device 1000, which is one embodiment of the present invention. A length 310aL of the region 310a is greater than or equal to 20 nm and less than 1000 nm. A width 310aW of the region 310a is greater than or equal to 20 nm and less than 600 nm. Furthermore, a length 310bL of the region 310b is greater than or equal to 20 nm and less than 1000 nm. A width 310bW of the region 310b is greater than or equal to nm and less than 600 nm. Note that the region 310a may be arranged in any position between the nodes FN1 and FN2. Furthermore, the shape of the region 310a is not limited to the shape illustrated in FIG. 4A and can be any appropriate shape. For example, two regions 310a may be included as illustrated in FIG. 5A. Alternatively, the region 310a may have a trapezoidal shape as illustrated in FIG. 5B. Further alternatively, the region 310a may have a polygonal shape whose corner portions are partly cut as illustrated in FIG. 5C.

Figure 6A:
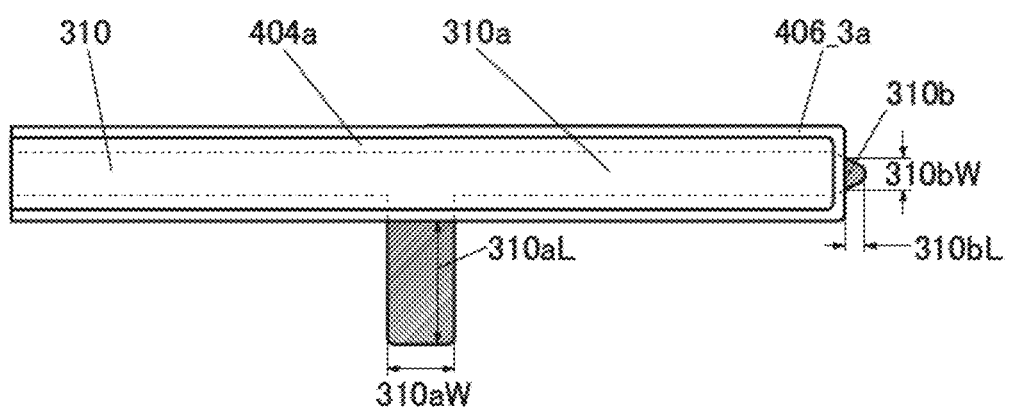
FIGS. 6A and 6B are top views each illustrating a semiconductor device of one embodiment of the present invention.
Figure 6B:
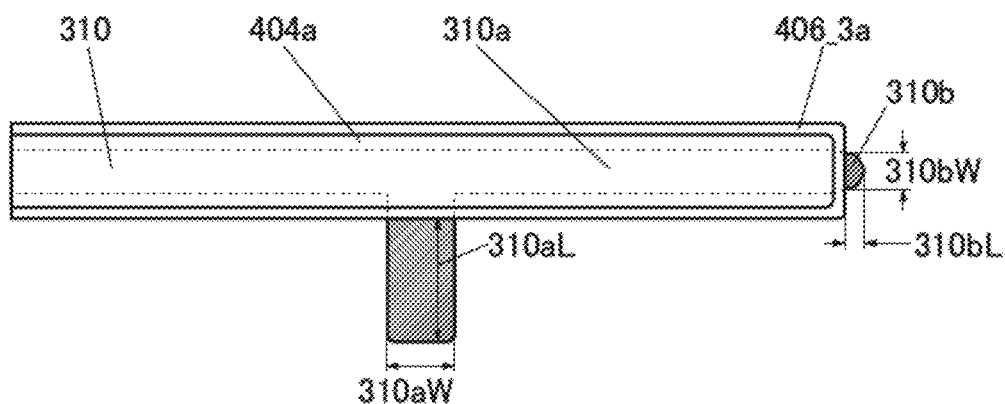

Furthermore, the shape of the region 310b is not limited to the shape illustrated in FIG. 4A and can be any appropriate shape. For example, the region 310b may have a trapezoidal shape as illustrated in FIG. 6A. Alternatively, the region 310b may have a polygonal shape whose corer portions are partly cut as illustrated in FIG. 6B. Furthermore, the shape of the region 310a in any of FIGS. 5A to 5C and the shape of the region 310b in any of FIGS. 6A and 6B can be combined as appropriate.

<Semiconductor Device Structure 2>

FIGS. 2A to 2D illustrate a semiconductor device 1000A having a structure different from that in FIGS. 1A to 1D. FIG. 2A is a top view of the memory cells A and B. FIG. 2B is a cross-sectional view taken along dashed-dotted line A1-A2 in FIG. 2A. FIG. 2C is a cross-sectional view taken along dashed-dotted line A3-A4 in FIG. 2A. FIG. 2D is a cross-sectional view taken along dashed-dotted line B1-B2 in FIG. 2A.

The structure of the semiconductor device 1000A is different from the semiconductor device 1000 illustrated in FIGS. 1A to 1D in that the conductor 310 has the regions 310a extending beyond the oxide 406_3a on both sides of the oxide 406_3a. Furthermore, the region 310a and the region 310b may have the shape illustrated in any of FIGS. 5A to 5C and FIGS. 6A and 6B. The description of the semiconductor device 1000 can be referred to for the other components and effects.

<Semiconductor Device Structure 3>

FIGS. 3A to 3D illustrates a semiconductor device 1000B having a structure different from that in FIGS. 1A to 1D. FIG. 3A is a top view of the memory cells A and B. FIG. 3B is a cross-sectional view taken along dashed-dotted line A1-A2 in FIG. 3A. FIG. 3C is a cross-sectional view taken along dashed-dotted line A3-A4 in FIG. 3A. FIG. 3D is a cross-sectional view taken along dashed-dotted line B1-B2 in FIG. 3A.

The structure of the semiconductor device 1000B is different from that of the semiconductor device 1000 illustrated in FIGS. 1A to 1D in that the perimeter portion of the conductor 310 is provided on the outer side of the perimeter portion of the oxide 406_3a. With such a structure, an electric field due to the negative potential applied to the conductor 310 can be sufficiently supplied to the entire oxide 406_3a; thus, a leakage path is not formed between the nodes FN1 and FN2 in the oxide 406_3a. The description of the structure of the transistor device 1000 can be referred to for the other components and functions.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

The transistor is surrounded by an insulator that has a function of inhibiting penetration of oxygen and impurities such as hydrogen, whereby the transistor can have stable electrical characteristics. For example, an insulator with a function of inhibiting penetration of oxygen and impurities such as hydrogen may be used as each of the insulators 303, 401a, 401b, 408a, 408b, 408c, 415, 418, 422, and 424.

An insulator with a function of inhibiting penetration of oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 303, 401a, 401b, 408a, 408b, 408c, 415, 418, 422, and 424 may be each formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 303, 401a, 401b, 408a, 408b. 408c, 415, 418, 422, and 424 each preferably include aluminum oxide.

For example, when the insulator 422 is formed using plasma including oxygen, oxygen can be added to the insulator 402 serving as a base layer. The added oxygen serves as excess oxygen in the insulator 402, and is added to the oxides 406_1a, 406_1b, 406_2a, 406_2b, 406_3a, 406_3b and 406_3c through the insulator 402 by heat treatment or the like, so that oxygen defects in the oxides 406_1a, 406_1b, 406_2a, 406_2b, 406_3a, 406_3b, and 406_3c can be repaired.

For example, when the insulator 415 is formed using plasma including oxygen, oxygen can be added to the insulator 410. The added oxygen serves as excess oxygen in the insulator 410, and is added to the oxides 406_1a, 406_1b, 406_2a, 406_2b, 406_3a, 406_3b, and 406_3c through the insulator 410 by heat treatment or the like, so that oxygen defects in the oxides 406_1a, 406_1b, 406_2a, 406_2b, 406_3a, 406_3b, and 406_3c can be repaired.

When the insulators 303, 401a, 401b, 408a, 408b, 408c, 415, 418, 422, and 424 include aluminum oxide, outward diffusion of the excess oxygen added to the oxides 406_1a, 406_1b, 406_2a, 406_2b, 406_3a, 406_3b, and 406_3c can be reduced.

The insulators 301, 302, 402, 412a, 412b, and 412c can each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, 412a, 412b, and 412c preferably contain silicon oxide or silicon oxynitride.

In particular, the insulators 402, 412a, 412b, and 412c preferably include an insulator with a high relative permittivity. For example, the insulators 402, 412a, 412b, and 412c each preferably contain gallium oxide, hafnium oxide, oxide containing aluminum and hafnium, oxynitride containing aluminum and hafnium, oxide containing silicon and hafnium, oxynitride containing silicon and hafnium, or the like. Alternatively the insulators 402, 412a, 412b, and 412c each preferably have a stacked-layer structure of silicon oxide or silicon oxynitride and an insulator with a high relative permittivity. Because silicon oxide and silicon oxynitride have thermal stability, combination of silicon oxide or silicon oxynitride with an insulator with a high relative permittivity allows the stacked-layer structure to be thermally stable and have a high relative permittivity. For example, when aluminum oxide, gallium oxide, or hafnium oxide is positioned on the oxides 406_3a, 406_3b, and 406_3c side, entry of silicon included in silicon oxide or silicon oxynitride into the oxides 406_2a and 406_2b can be inhibited. When silicon oxide or silicon oxynitride is positioned on the oxides 406_3a, 406_3b, and 406_3c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An insulator with a function of inhibiting penetration of oxygen and impurities such as hydrogen may be used as each of the barrier films 417a1, 417a2, 417b1, and 417b2. The barrier films 417a1, 417a2, 417b1, and 417b2 can prevent excess oxygen included in the insulator 410 from diffusing to the conductors 416a1, 416a2, 416b1, and 416b2.

The barrier films 417a1, 417a2, 417b1, and 417b2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example. Note that the barrier films 417a1, 417a2, 417b1, and 417b2 preferably include silicon nitride.

<Conductor>

The conductors 404a, 404b, 404c, 310, 416a1, 416a2, 416b1, and 416b2 can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With any of such materials, hydrogen contained in the oxides 406_1a, 406_1b, 406_2a, 406_2b, 406_3a, 406_3b and 406_3c can be captured in some cases. Alternatively, hydrogen entering from an external insulator can be captured in some cases.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively a stacked-layer structure formed using a combination of a material including any of the metal elements listed above, a conductive material including oxygen, and a conductive material including nitrogen may be used.

When an oxide semiconductor is used for the channel formation region of the transistor, a stacked-layer structure formed using a material containing the above-described metal element and a conductive material containing oxygen is preferably used for the gate electrode. In that case, the conductive material containing oxygen is preferably formed on the channel formation region side. When the conductive material containing oxygen is formed on the channel formation region side, oxygen released formed the conductive material is likely to be supplied to the channel formation region.

<Oxide>

As the oxides 406_1a, 406_1b, 406_2a, 406_2b, 406_3a, 406_3b, and 406_3c, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

Next, an oxide that can be used as the oxides 406_1a, 406_1b, 406_2a, 406_2b, 406_3a, 406_3b, 406_3c, and the like is described.

An oxide semiconductor preferably contains at least indium or zinc. In particular indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is InMZnO containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium neodymium, hafnium, tantalum, tungsten, and magnesium. Note that two or more of the above elements may be used in combination as the element M.

<Structure>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

The a-like OS has a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Atomic Ratio>

Next, preferred ranges of the atomic ratio of indium, the element M, and zinc contained in an oxide semiconductor according to the present invention are described with reference to FIGS. 20A to 20C. Note that the proportion of oxygen atoms is not shown in FIGS. 20A to 20C. The terms of the atomic ratio of indium, the element M, and zinc contained in the oxide semiconductor are denoted by [In], [M], and [Zn], respectively.

Figure 20A:
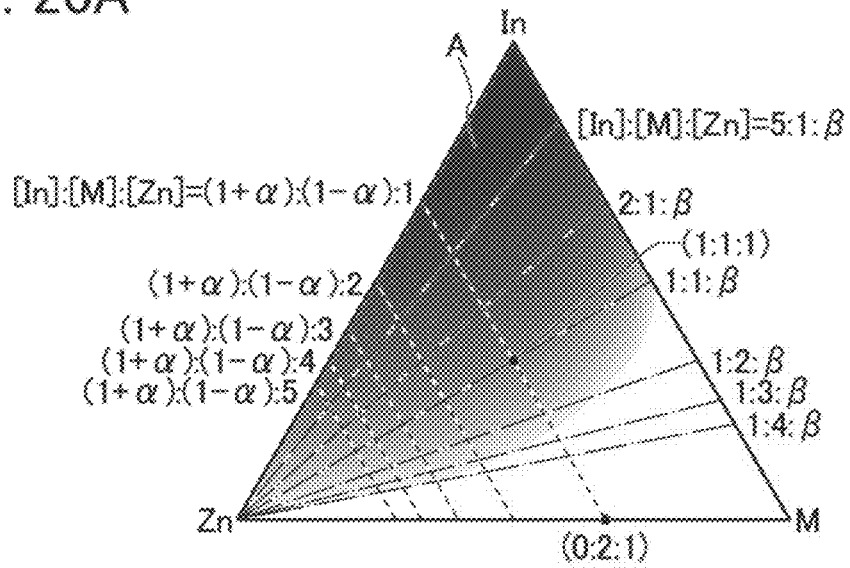
FIGS. 20A to 20C each illustrate an atomic ratio of an oxide of the present invention.
Figure 20B:
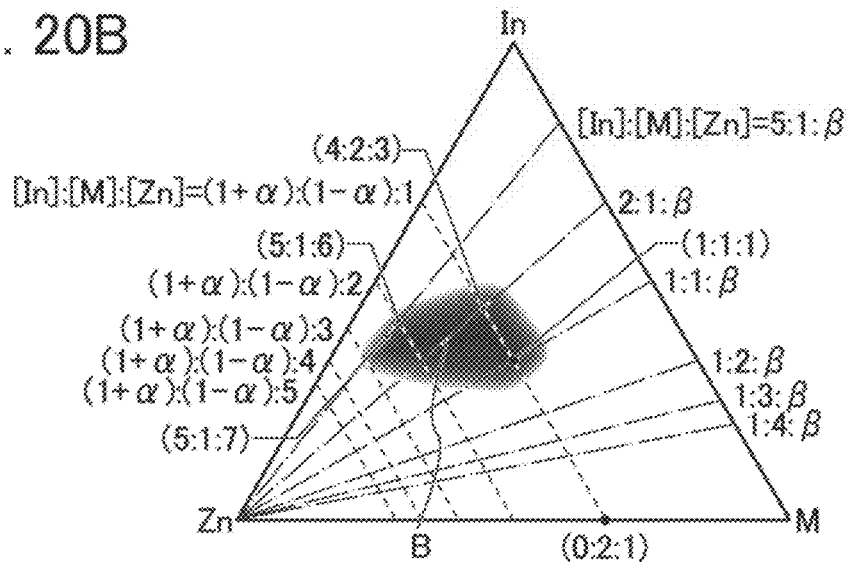
Figure 20C:
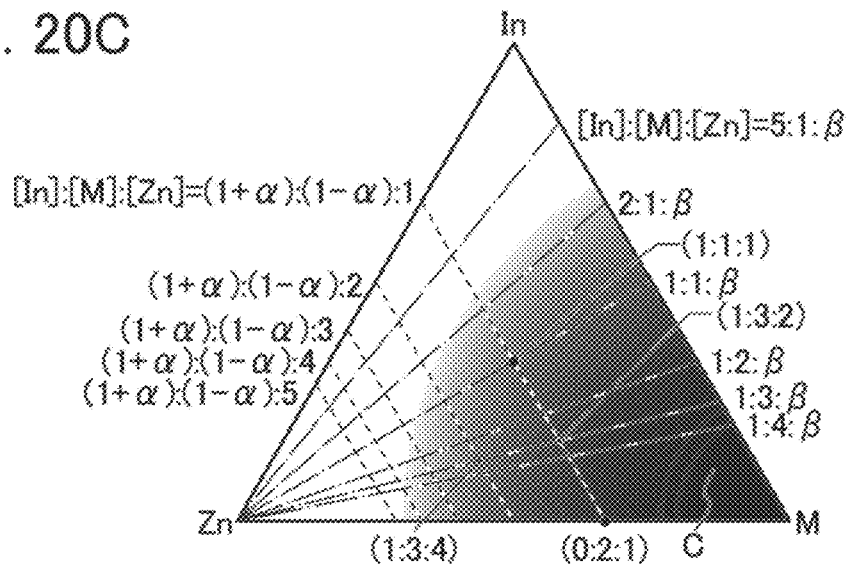

In FIGS. 20A to 20C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor with the atomic ratio [In]:[M]:[Zn] of 0:2:1 or around 0:2:1 in FIGS. 20A to 20C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 20A shows an example of the preferred ranges of the atomic ratio of indium, the element M, and zinc contained in an oxide semiconductor.

In addition, the oxide semiconductor having a high content of indium can have high carrier mobility (electron mobility). Therefore, an oxide semiconductor having a high content of indium has higher carrier mobility than that of an oxide semiconductor having a low content of indium.

In contrast, carrier mobility decreases as the indium content and the zinc content in an oxide semiconductor become lower. Thus, with an atomic ratio of [In]:[M]:[Zn] =0:1:0 and the vicinity thereof (e.g., a region C in FIG. 20C), insulation performance becomes better.

Accordingly, an oxide semiconductor in one embodiment of the present invention preferably has an atomic ratio represented by a region A in FIG. 20A. With the atomic ratio, a layered structure with high carrier mobility and a few grain boundaries is easily obtained.

In the region A, in particular a region B in FIG. 20B, an excellent oxide semiconductor which easily becomes a CAAC-OS and has high carrier mobility can be obtained.

The CAAC-OS is an oxide semiconductor with high crystallinity In contrast, in the CAAC-OS, a reduction in electron mobility due to the grain boundary is less likely to occur because a clear grain boundary cannot be observed.

Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

[Transistor Including Oxide Semiconductor]

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/\text{cm}^3$, preferably lower than $1 \times 10^{11}/\text{cm}^3$, more preferably lower than $1 \times 10^{10}/\text{cm}^3$, and greater than or equal to $1 \times 10^{-9}/\text{cm}^3$ is used.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to be released and may behave like fixed electric charge. Thus, the transistor whose channel region is formed in the oxide semiconductor having a high density of trap states has unstable electrical characteristics in some cases.

In view of the above, to obtain stable electrical characteristics of the transistor, it is effective to reduce the concentration of impurities in the oxide semiconductor In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel silicon, and the like are given.

<Impurity>

Here, the influence of impurities in the oxide semiconductor is described.

When silicon or carbon, which is a Group 14 element, is contained in the oxide semiconductor, defect states are formed in the oxide semiconductor. Thus, the concentration of silicon or carbon in the oxide semiconductor and around an interface with the oxide semiconductor (the concentration obtained by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide easily becomes n-type by generation of electrons serving as carriers and an increase of carrier density. Thus, a transistor in which an oxide semiconductor containing nitrogen is used as a semiconductor is likely to have normally-on characteristics. For this reason, nitrogen in the oxide semiconductor is preferably reduced as much as possible. For example, the nitrogen concentration in the oxide semiconductor measured by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide semiconductor that contains hydrogen is likely to have normally-on characteristics. Accordingly, it is preferred that hydrogen in the oxide semiconductor be reduced as much as possible. Specifically, the hydrogen concentration in the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel region in a transistor, the transistor can have stable electrical characteristics.

<Band Diagram>

Figure 21A:
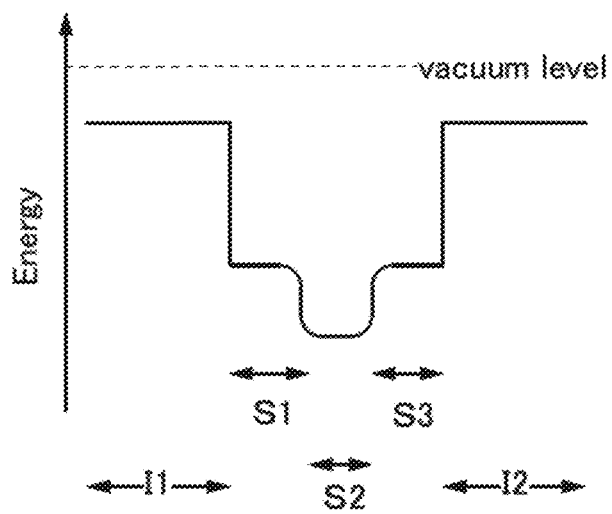
FIGS. 21A to 21C are each a band diagram of a stacked-layer structure of an oxide.
Figure 21B:
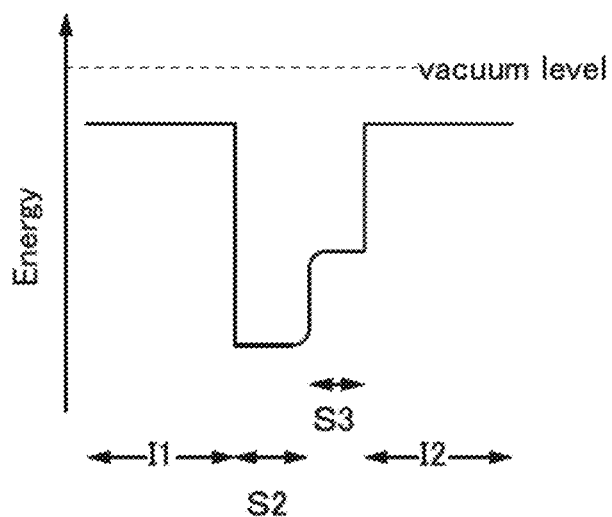
Figure 21C:
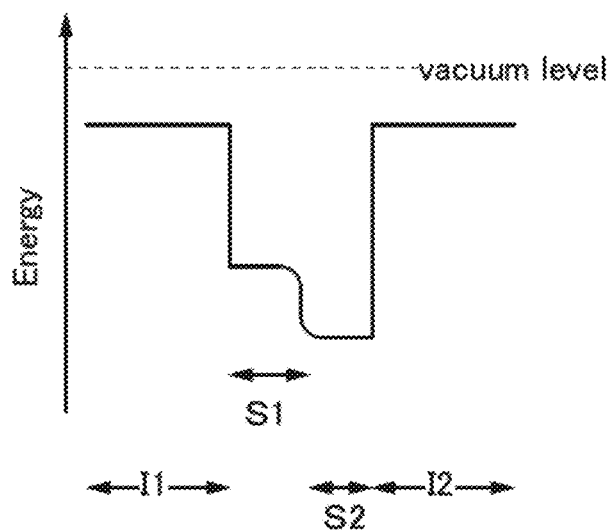

Next, the case where the oxide semiconductor has a two-layer structure or a three-layer structure will be described. With reference to FIGS. 21A to 21C, the description is made on a band diagram of a layered structure of an oxide semiconductor S1, an oxide semiconductor S2, and an oxide semiconductor S3 and insulators that are in contact with the layered structure; a band diagram of a layered structure of the oxide semiconductor S2 and the oxide semiconductor S3 and insulators that are in contact with the layered structure; and a band diagram of a layered structure of the oxide semiconductor S1 and the oxide semiconductor S2 and insulators that are in contact with the layered structure.

FIG. 21A is an example of a band diagram of a layered structure including an insulator I1, the oxide semiconductor S1, the oxide semiconductor S2, the oxide semiconductor S3, and an insulator I2 in the thickness direction. FIG. 21B is an example of a band diagram of a layered structure including the insulator I1, the oxide semiconductor S2, the oxide semiconductor S3, and the insulator I2 in the thickness direction. FIG. 21C is an example of a band diagram of a layered structure including the insulator I1, the oxide semiconductor S1, the oxide semiconductor S2, and the insulator I2 in the thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in the energy level of the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As illustrated in FIGS. 21A to 21C, the energy level of the conduction band minimum of each of the oxide semiconductors S1 to S3 is gradually varied. In other words, the energy level of the conduction band minimum is continuously varied or continuous junction is formed. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, when the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a large on-state current can be obtained.

When an electron is trapped in a trap state, the trapped electron behaves like fixed electric charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. Accordingly, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 20C can be used as the oxide semiconductors S1 and S3. Note that the region C in FIG. 20C represents the atomic ratio [In]:[M]:[Zn] of 0:1:0, 1:3:2, and 1:3:4 and the vicinities thereof.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

(Embodiment 2)
<Method for Manufacturing Semiconductor Device>

A method for manufacturing the semiconductor device 1000 of one embodiment illustrated in FIGS. 1A to 1D will be described below with reference to FIGS. 9A to 9D to FIGS. 18A to 18D. FIGS. 9A to 18A are top views. FIGS. 9B to 18B are cross-sectional views taken along dashed-dotted line A1-A2 in FIGS. 9A to 18A. FIGS. 9C to 18C are cross-sectional views taken along dashed-dotted line A3-A4 in FIGS. 9A to 18A. FIGS. 9D to 18D are cross-sectional views taken along dashed-dotted line B1-B2 in FIGS. 9A to 18A.

First, the substrate 400 is prepared.

Next, the insulator 401a is formed. The insulator 401a can be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CV) method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; this, it is sometimes preferable to combine an ALD method with another deposition method with a high deposition rate such as a CVD method.

When a CVD method or an AD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Next, the insulator 401b is formed over the insulator 401a. The insulator 401b can be formed by a sputtering method, a CVD method, a MBE method, a PLD method, an ALD method, or the like. Then, the insulator 301 is formed over the insulator 401b. The insulator 301 can be formed by a sputtering method, a CVD method, a MBE method, a PLD method, an ALD method, or the like (see FIGS. 9A to 9D).

Then, a groove is formed in the insulator 301 so as to reach the insulator 401b. Examples of the groove include a hole and an opening. In forming the groove, wet etching may be employed; however, dry etching is preferably employed in terms of microfabrication. The insulator 401b is preferably an insulator that functions as an etching stopper film used in forming the groove by etching the insulator 301. For example, in the case where a silicon oxide film is used as the insulator 301 in which the groove is to be formed, the insulator 401b is preferably formed using a silicon nitride film, an aluminum oxide film or a hafnium oxide film.

In this embodiment, aluminum oxide is deposited as the insulator 401a by an ALD method, and aluminum oxide is deposited as the insulator 401b by a sputtering method.

After the formation of the groove, a conductor to be the conductor 310 is formed. The conductor to be the conductor 310 desirably includes a conductor that has a function of inhibiting the passage of oxygen. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductor to be the conductor 310 can be formed by a sputtering method, a CVD method, an MBE method, a PLD method, an ALD method, or the like.

In this embodiment, as a conductor to be the conductor 310, tantalum nitride is deposited by a sputtering method, titanium nitride is deposited over the tantalum nitride by a CVD method, and tungsten is deposited over the titanium nitride by a CVD method.

Next, chemical mechanical polishing (CMP) is performed to remove the conductor to be the conductor 310 over the insulator 301. Consequently, the conductor to be the conductor 310 remains only in the groove, whereby the conductor 310 with a flat top surface can be formed (see FIGS. 10A to 10D).

Next, the insulator 302 is formed over the insulator 301 and the conductor 310. The insulator 302 can be formed by a sputtering method, a CVD method, an MBE method, a PLD method, an ALD method, or the like.

Then, the insulator 303 is formed over the insulator 302. The insulator 303 can be deposited by a sputtering method, a CVD method, an MBE method, a PLD method, an ALD method, or the like.

Then, the insulator 402 is formed over the insulator 303. The insulator 402 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 450° C. and lower than or equal to 600° C. more preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, impurities such as hydrogen and water included in the insulator 402 can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas with the apparatus, plasma treatment using oxygen in order to compensate released oxygen may be performed. Note that first heat treatment is not necessarily performed in some cases.

Next, an oxide 406_1 is formed over the insulator 402. The oxide 406_1 can be formed by a sputtering method, a CVD method, an MBE method, a PLD method, an ALD method, or the like.

Next, treatment for adding oxygen to the oxide 406_ may be performed. Examples of the treatment for adding oxygen include an ion implantation method and a plasma treatment method. Note that oxygen added to the oxide 406_1 serves as excess oxygen. Next, the oxide 406_2 is formed over the oxide 406_1.

After that, second heat treatment may be performed. For the second heat treatment, the conditions for the first heat treatment can be used. By the second heat treatment, the crystallinity of the oxide 406_2 can be increased and impurities such as hydrogen and water can be removed, for example. Preferably, treatment at 400° C. in a nitrogen atmosphere for one hour and treatment at 400° C. in an oxygen atmosphere for one hour are successively performed in this order.

Next, a conductor 416 is formed over the oxide 406_2. The conductor 416 can be formed by a sputtering method, a CVD method, an MBE method, a PLD method, an ALD method, or the like. As the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is deposited, and a material including one or more of metal elements selected from aluminum, chromium, copper, silver, gold, platinum, tantalum, nickel titanium, molybdenum, tungsten, hafnium, vanadium, niobium, manganese, magnesium, zirconium, beryllium, indium, and the like, a semiconductor with high electric conductivity, typified by polycrystalline silicon including an impurity element such as phosphorus, or a silicide such as nickel silicide may be deposited over the oxide.

The oxide may have a function of absorbing hydrogen in the oxides 406_1 and 406_2 and capturing hydrogen diffused from the outside, thus, the electrical characteristics and reliability of the transistors 100a and 100b are improved in some cases. Titanium instead of the oxide may have a similar function.

Then, a barrier film 417 is formed over the conductor 416. The barrier film 417 can be formed by a sputtering method, a CVD) method, an MBE method, a PLD method, an ALD method, or the like. In this embodiment, aluminum oxide is deposited as the barrier film 417.

Subsequently a conductor 411 is formed over the barrier film 417. The conductor 411 can be formed by a sputtering method, a CVD method, an MBE method, a PLD method, an ALD method, or the like. In this embodiment, tantalum nitride is deposited as the conductor 411 (see FIGS. 11A to 11D).

Next, the conductor 411 and the barrier film 417 are processed by a lithography method to form a conductor 411a and a barrier film 417a. Through this processing, a tapered cross section is preferably formed. The taper angle between the cross section and a plane parallel to the bottom surface of the substrate is greater than or equal to 30° and less than 75°, preferably greater than or equal to 30° and less than 70°. With such a taper angle, coverage with films formed later in the manufacturing process can be improved. The processing is preferably performed by a dry etching method. The dry etching method is suitable for microfabrication and the above described formation of a tapered shape (see FIGS. 12A to 12D).

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively a dry etching apparatus including a high-density plasma source can be used. As the dry etching apparatus including a high-density plasma source, an inductively coupled plasma (ICP) etching apparatus can be used, for example.

Next, a resist 421a and a resist 421b are formed by a lithography method. Next, the conductor 411, the barrier film 417, the conductor 416 are etched with the use of the resists 421a and 421b as an etching mask to form a conductor 411a1, a conductor 411a2, a conductor 411b1, a conductor 411b2, the barrier films 417a1, 417a2, 417b1, and 417b2, and the conductors 416a and 416b (see FIGS. 13A to 13D).

Then, after the resist 421 is removed, with the use of portions of the conductors 411a1, 411a2, 411b1, 411b2, 416a, and 416b, each of whose surface is exposed, as etching masks, the oxides 406_1 and 406_2 are etched to form the oxides 406_1a, 406_2a, 406_1b, and 406_2b (see FIGS. 14A to 14D).

Next, the portion of the conductors 411a1, 411a2, 411b1, 411b2, 416a, and 416b in each of which the surface exposed is etched, so that conductors 416a1, 416a2, 416b1, and 416b2 are formed.

Then, washing treatment may be performed using an aqueous solution in which hydrofluoric acid is diluted with pure water (diluted hydrogen fluoride solution). A diluted hydrogen fluoride solution refers to a solution in which hydrofluoric acid is mixed into pure water at a concentration of approximately 70 ppm. Next, third heat treatment is performed. For the third heat treatment, the conditions for the first heat treatment can be used. Preferably, treatment at 400° C. in a nitrogen atmosphere for one hour and treatment at 400° C. in an oxygen atmosphere for one hour are successively performed in this order.

In some cases, dry etching performed in the above process causes the attachment or diffusion of an impurity due to an etching gas to a surface or an inside portion of the oxides 406_1a, 406_2a, 406_1b, and 406_2b, or the like. The impurity is fluorine or chlorine, for example.

The upper portion of the oxide 406_1a and the upper portion of the oxide 406_2b are partly etched through the formation and the washing treatment of the conductors 416a1, 416a2, 416b1, and 416b2 described above, so that the oxide 406_1a and the oxide 406_2b have a rounded cross-sectional shape (round shape) in some cases (see FIGS. 15A to 15D). When the oxides 406_1a and 406_2b have a round shape, coverage with the oxide 406_3 and the conductor 404a which are formed thereover in a later step can be improved.

The above treatment allows a reduction in impurity concentration. Furthermore, the moisture concentration and the hydrogen concentration in the oxides 406_1a, 406_2a, 406_1b, and 406_2b can be reduced.

Then, an oxide to be the oxides 406_3a, 406_3b, and 406_3c is deposited. The oxide to be the oxides 406_3a, 406_3b, and 406_3c can be formed by a sputtering method, a CVD method, an MBE method, a PLD method, an ALD method, or the like. A sputtering method is especially preferred for the deposition. Furthermore, sputtering conditions are as follows: a mixed gas of oxygen and argon is used; the oxygen partial pressure is preferably high, further preferably 100%; and the deposition temperature is room temperature or higher than or equal to 100° C. and lower than or equal to 200° C.

The oxide to be the oxides 406_3a, 406_3b, and 406_3c is preferably deposited under the above conditions, in which case excess oxygen can be introduced into the oxides 406_2a, 406_2b, and the insulator 402.

Next, an insulator to be the insulators 412a, 412b, and 412c is deposited over the oxide to be the oxides 406_3a, 406_3b, and 406_3c. The insulator to be the insulators 412a, 412b, and 412c can be formed by a sputtering method, a CVD method, an MBE method, a PLD method, an ALD method, or the like.

Here, fourth heat treatment can be performed. For the fourth heat treatment, the conditions for the first heat treatment can be used. Preferably, treatment at 400° C. in a nitrogen atmosphere for one hour and treatment at 400° C. in an oxygen atmosphere for one hour are successively performed in this order. The moisture concentration and the hydrogen concentration in the insulator to be the insulators 412a, 412b, and 412c can be reduced by the fourth heat treatment.

Next, a conductor to be the conductors 404a, 404b, and 404c is deposited. The conductor to be the conductors 404a. 404b, and 404c can be formed by a sputtering method, a CVD method, an MBE method, a PLD method, an ALD method, or the like.

The conductor to be the conductors 404a, 404b, and 404c may be a multilayer film. For example, an oxide is deposited using conditions similar to those for the deposition of the oxide to be the oxides 406_3a, 406_3b, and 406_3c so that oxygen can be added to the insulator to be the insulators 412a, 412b, and 412c. Oxygen added to the insulator to be the insulators 412a, 412b, and 412c is excess oxygen.

Then, a conductor is formed over the oxide by a sputtering method, whereby the electric resistivity of the oxide can be decreased.

The conductors to be the conductors 404a, 404b, and 404c are processed by a lithography method to form the conductors 404a. 404b, and 404c (see FIGS. 16A to 16D).

After that, an insulator to be the insulators 408a. 408b, and 408c is formed. The insulator to be the insulators 408a, 408b, and 408c can be formed by a sputtering method, a CVD method, an MBE method, a PLD method, an ALD method, or the like. In the case where aluminum oxide is deposited as the insulator to be the insulators 408a, 408b, and 408c by an ALD method, the insulator to be the insulators 408a, 408b, and 408c can be formed on the top and side surfaces of the insulators 408a, 408b, and 408c to have an even thickness and few pin holes, resulting in prevention of oxidation of the conductors 404a, 404b, and 404c.

Next, the insulator to be the insulators 408a, 408b, and 408c, the insulator to be the insulators 412a, 412b, and 412c, and the oxide to be the oxides 406_3a, 406_3b, and 406_3c are processed by a lithography method to form the insulators 408a, 408b, 408c, 412a, 412b, and 412c and the oxides 406_3a, 406_3b, and 4063c (see FIGS. 17A to 17D).

Next, the insulator 422 is formed. The insulator 422 can be formed by a sputtering method, a CVD method, an MBE method, a PLD method, an ALD method, or the like. In this embodiment, aluminum oxide is deposited by a sputtering method, in which case oxygen can be added to the insulator 402. With heat treatment performed after the deposition of aluminum oxide, oxygen can be added to the oxides 406_1a, 406_2a, 406_1b, and 406_2b and hydrogen contained in the oxides 406_1a, 406_2a, 406_1b, and 406_2b can be reduced.

Next, the insulator 424 is formed. The insulator 424 can be formed by a sputtering method, a CVD method, an MBE method, a PLD method, an ALD method, or the like. In this embodiment, aluminum oxide is deposited by an ALD method, in which case entry of hydrogen from the outside can be prevented (see FIGS. 18A to 18D).

Next, an insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

For the formation of the insulator 410, a CVD method is preferably employed. More preferably, a plasma CVD method is employed. In the case of formation by a plasma CVD method, a step 1 of depositing an insulator and a step 2 of performing treatment using plasma containing oxygen may be repeatedly conducted. By conducting the step 1 and the step 2 more than once, the insulator 410 including excess oxygen can be formed.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 410 is not necessarily flat.

Then, the insulator 415 is formed over the insulator 410. The insulator 415 can be formed by a sputtering method, a CVD method, an MBE method, a PLD method, an ALD method, or the like. A sputtering method is preferably used in formation of the insulator 415. The insulator 415 may be formed by a sputtering method successively after heat treatment in vacuum or reverse sputtering is performed.

When the insulator 415 is formed by a sputtering method with the use of plasma including oxygen, oxygen can be added to the insulator 410. The added oxygen serves as excess oxygen in the insulator 410 and is added to the oxides 406_1a, 406_1b, 406_2a, 406_2b, 406_3a, 406_3b, and 406_3c by heat treatment or the like, so that oxygen defects in the oxides 406_1a, 406_1b, 406_2a, 406_2b, 406_3a, 406_3b, and 406_3c can be repaired. In addition, the moisture concentration and the hydrogen concentration in the insulator 410 can be reduced.

Next, the insulator 418 is formed over the insulator 415. The insulator 418 can be formed by a sputtering method, a CVD method, an MBE method, a PLD method, an ALD method, or the like. For the formation of the insulator 418, an ALD method is preferably employed. For example, when the insulator 418 contains aluminum oxide, impurities such as hydrogen can be prevented from entering the oxides 406_1a, 406_1b, 406_2a, 406_2b, 406_3a, 406_3b, and 406_3c. Furthermore, for example, when the insulators 401a, 402b, 408a, 408b, 408c, 415, and 418 contain aluminum oxide, outward diffusion of the oxygen added to the oxides 406_1a, 406_1b, 406_2a, 406_2b, 406_3a, 406_3b, and 406_3c can be reduced.

Next, a fifth heat treatment may be performed. For the fifth heat treatment, the conditions for the first heat treatment can be used. Preferably, treatment at 400° C. in a nitrogen atmosphere for one hour and treatment at 400° C. in an oxygen atmosphere for one hour are successively performed in this order. The moisture concentration and the hydrogen concentration in the insulator 410 can be reduced by the fifth heat treatment. Through the above steps, the semiconductor device 1000 shown in FIGS. 1A to 1D can be manufactured.

Note that the structures, methods, and the like described in this embodiment can be combined with any of the structures, methods, and the like described in the other embodiments and examples as appropriate.

(Embodiment 3)
<Structure of Semiconductor Device>

In this embodiment, an example of a semiconductor device including any of the transistors disclosed in this specification and the like is described.

Figure 19:
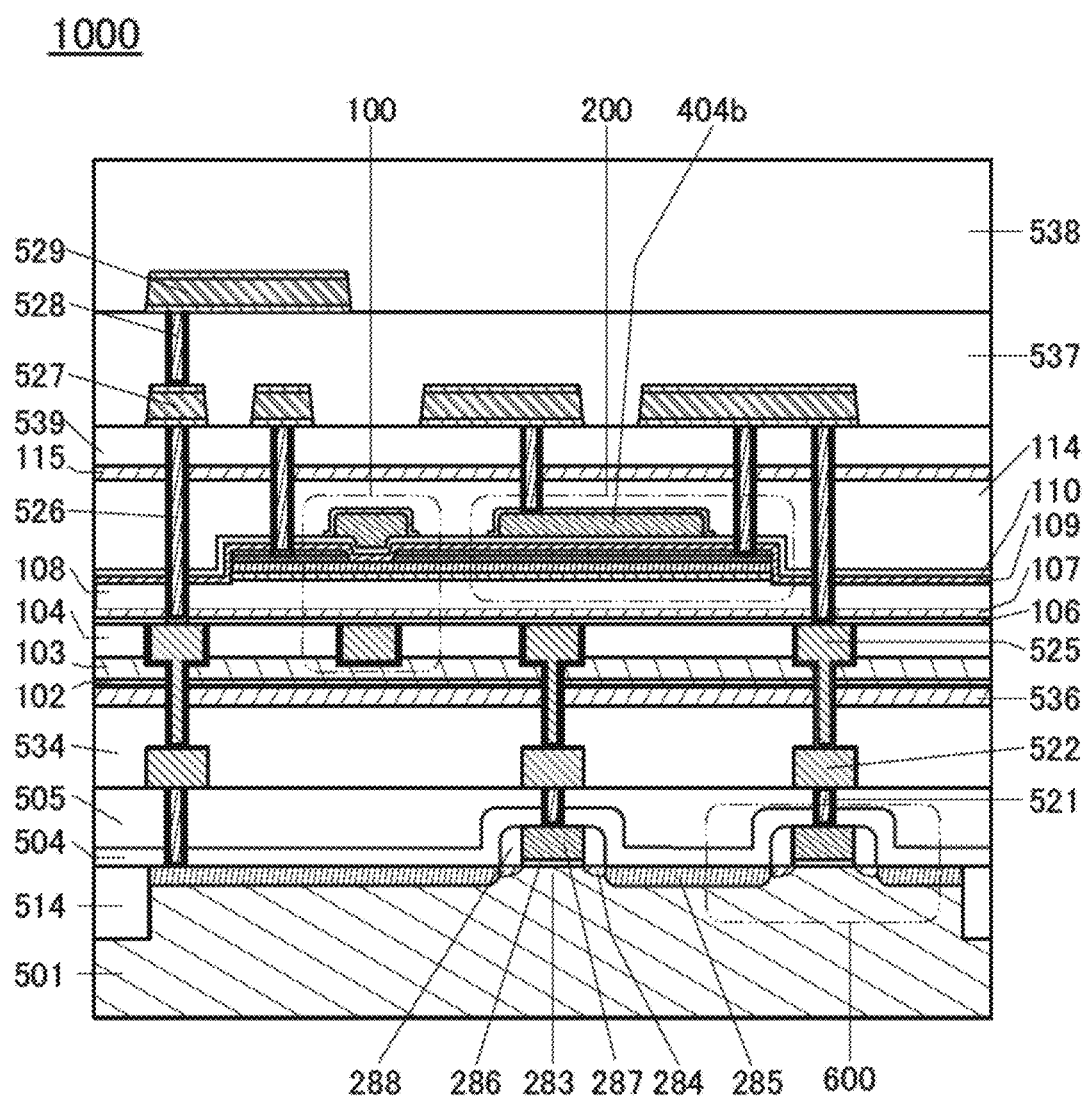
FIG. 19 illustrates a semiconductor device of one embodiment of the present invention.

FIG. 19 is a cross-sectional view of a semiconductor device 1000. The semiconductor device 1000 includes the transistor 100, the transistor 600, and a capacitor 200. The transistors 100 and 600 and the capacitor 200 correspond to the transistors 100a and 600a and the capacitor 200a illustrated in FIG. 8, respectively.

In the semiconductor device 1000, an n-type semiconductor is used for a substrate 501. The transistor 600 includes a channel formation region 283, high-concentration p-type impurity regions 285, an insulator 286, a conductor 287, and a sidewall 288. In regions overlapping with the sidewall 288 with the insulator 286 located therebetween, low-concentration p-type impurity regions 284 are provided. The insulator 286 can function as a gate insulator. The conductor 287 can function as a gate conductor. The channel formation region 283 of the transistor 600 is formed in part of the substrate 501.

The low-concentration p-type impurity regions 284 can be formed in such a manner that an impurity element is added with the use of the conductor 287 as a mask after formation of the conductor 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 600 is electrically isolated from other transistors by an element isolation layer 514. The element isolation layer can be formed by a local oxidation of silicon (LOCOS) method, a shallow trench isolation (STI) method, or the like.

In the semiconductor device 1000, an insulator 534 and an insulator 536 are provided over an insulator 505 covering the transistor 600. In addition, the semiconductor device 1000 includes a conductor 522 over the insulator 505.

The conductor 522 is electrically connected to the transistor 600 through a conductor 521 provided in the insulators 504, and 505.

The semiconductor device 1000 includes the transistors 100 and the capacitor 200 over the insulator 536 with insulators 102, 103, 104, 106, 107, and 108 provided therebetween. Insulators 114, 115, and 539 are provided over the transistor 100 and the capacitor 200, and a conductor 527 is provided over the insulator 539. Furthermore, an insulator 537 covering the conductor 527 is provided.

The one of the source electrode and the drain electrode of the transistor 100 functions as one electrode of the capacitor 200, and the conductor 404*b* functions as the other electrode of the capacitor 200. The region where one of the source electrode and the drain electrode of the transistor 100 and the conductor 404*b* overlap serves as the capacitor 200.

The conductor 527 is electrically connected to a source or a drain of the transistor 100 through a conductor 526 provided in part of the insulators 539, 115, 114, 110, and 109 and a barrier film 417.

The conductor 529 is provided over the insulator 537 and an insulator 538 is provided over the conductor 529. The conductor 529 is electrically connected to the conductor 527 through a conductor 528 provided in part of the insulator 537.

The insulators 102, 103, 104, 106, 107, 108, 109, 110, 115, 534, 536, 539, 537, and 538 can be formed using a material and a method which are similar to those of the insulators described in the above embodiments and the like. The conductors 521, 522, 525, 526, 527, and 529 can be formed using a material and a method which are similar to those of the conductors described in the above embodiments and the like.

The conductors 521, 522, 525, 526, 527, 528, and 529 may be formed by a damascene method, a dual damascene method, or the like.

According to one embodiment of the present invention, the leakage current between the memory cells can be reduced. That is, according to one embodiment of the present invention, a memory device with high productivity can be provided. According to one embodiment of the present invention, a memory device which can retain data for a long period even when power supply is stopped can be provided. For example, a memory device which can retain data for a year or more, ten years or more after power supply is stopped can be provided. Thus, a memory device of one embodiment of the present invention can be regarded as a nonvolatile memory. The structure described above in this embodiment can be combined with any of the structures described in the other embodiments and examples as appropriate. The structure described above in this embodiment can be applied to electronic devices. For example, the structure can be applied to a memory device included in an electronic device and a CPU. Furthermore, the structure can be applied to a display device. For example, the structure can be applied to a pixel circuit and a driver of a display device.

(Embodiment 4)
<Electronic Device>

A semiconductor device of one embodiment of the present invention can be used for a variety of electronic devices. FIGS. 28A to 28G illustrate specific examples of the electronic devices including the semiconductor device of one embodiment of the present invention.

Figure 28A:
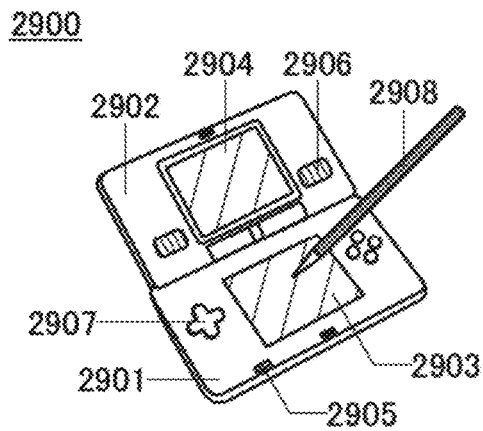
FIGS. 28A to 28G each illustrate an electronic device of one embodiment of the present invention.

A portable game machine 2900 illustrated in FIG. 28A includes a housing 2901, a housing 2902, a display portion 2903, a display portion 2904, a microphone 2905, a speaker 2906, an operation switch 2907, and the like. In addition, the portable game machine 2900 includes an antenna, a battery and the like inside the housing 2901. Although the portable game machine in FIG. 28A has the two display portions 2903 and 2904, the number of display portions is not limited to this. The display portion 2903 is provided with a touch screen as an input device, which can be handled with a stylus 2908 or the like.

Figure 28B:
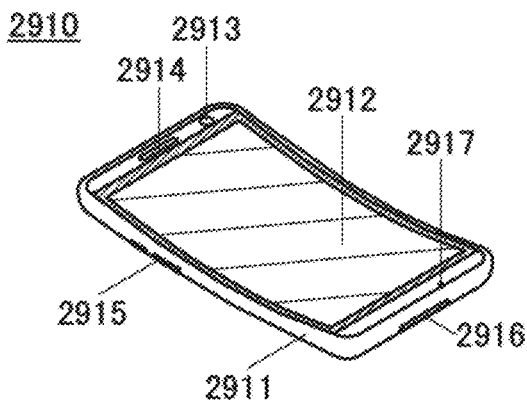

An information terminal 2910 illustrated in FIG. 28B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery and the like are provided. The information terminal 2910 can be used as, for example, a smartphone, a mobile phone, a tablet information terminal, a tablet personal computer, or an e-book reader.

Figure 28C:
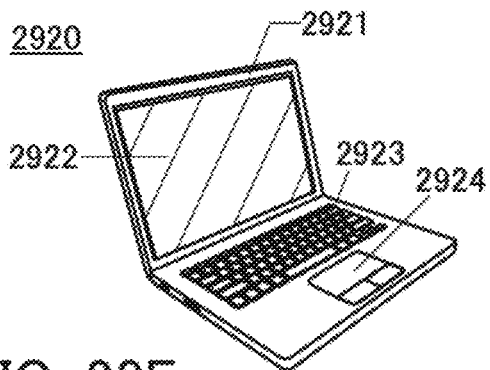

A notebook personal computer 2920 illustrated in FIG. 28C includes a housing 2921, a display portion 2922, a keyboard 2923, a pointing device 2924, and the like. In the housing 2921 of the notebook personal computer 2920, an antenna, a battery, and the like are provided.

Figure 28D:
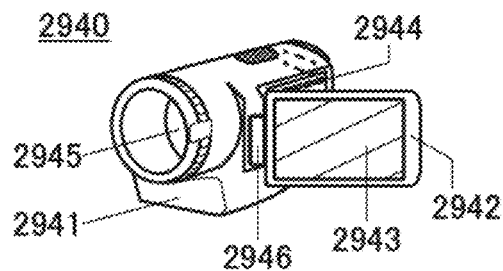

A video camera 2940 illustrated in FIG. 28D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery) and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 28E:
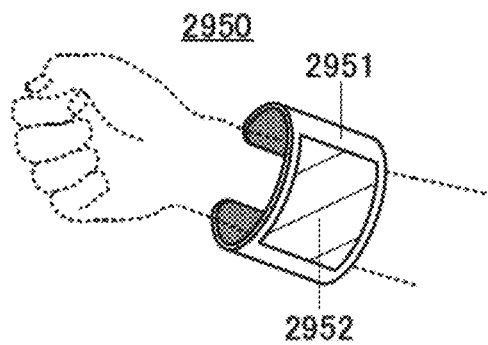

FIG. 28E illustrates an example of a bangle-type information terminal. An information terminal 2950 includes a housing 2951, a display portion 2952, and the like. In the housing 2951 of the information terminal 2950, an antenna, a battery and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 28F:
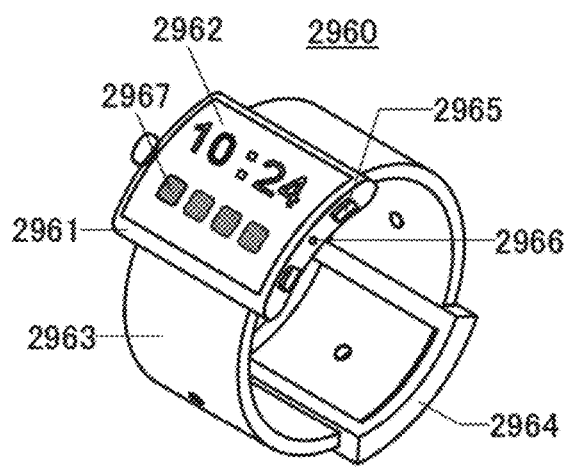

FIG. 28F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/oft on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and this hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

Figure 28G:
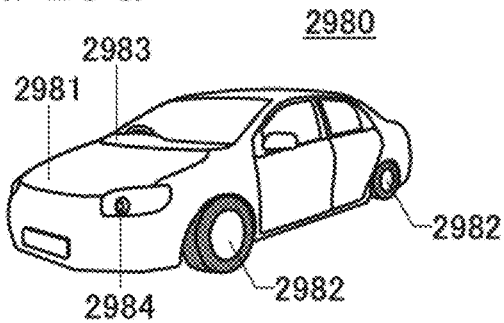

FIG. 28G is an external view illustrating an example of a car. A car 2980 includes a car body 2981, wheels 2982, a dashboard 2983, lights 2984, and the like. The car 2980 also includes an antenna, a battery, and the like.

For example, a memory device including the semiconductor device of one embodiment of the present invention can retain control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments, examples, and the like.

EXAMPLE 1

In this example, semiconductor devices which are one embodiment of the present invention were manufactured, and the results of evaluating the reliability of the semiconductor devices will be shown.

To manufacture the semiconductor device, first, a transistor including a channel formation region in single crystal silicon and a substrate including a wiring layer were prepared. Next, a 250-nm-thick first silicon oxynitride film was formed over the substrate by a CVD method. Then, a surface of the first silicon oxynitride film was planarized by first CMP treatment.

Next, a 10-nm-thick first aluminum oxide film was formed over the first silicon oxynitride film by an ALD method, a 40-nm-thick second aluminum oxide film was formed over the first aluminum oxide film by a sputtering method, and then, a 160-nm-thick second silicon oxynitride film was formed over the second aluminum oxide film by a CV) method.

Next, a 35-nm-thick first tungsten film was formed over the second silicon oxynitride film by a sputtering method. Then, the first tungsten film was processed by a lithography method, and a hard mask including the first tungsten film was formed.

Then, the second silicon oxynitride film, the second aluminum oxide film, the first aluminum oxide film, and the first silicon oxynitride film were processed by a lithography method, so that a contact hole reaching the wiring layer included in the substrate and a groove reaching the first aluminum oxide film were formed. Next, in the contact hole and the groove, a 40-nm-thick first tantalum nitride film was formed by a sputtering method. A 5-nm-thick first titanium nitride film and a 250-nm-thick second tungsten film were formed over the first tantalum nitride film by an ALD method and a CVD method, respectively. Then, the second tungsten film, the first titanium nitride film, the first tantalum nitride film, and the first tungsten film were polished by second CMP treatment reaching the top surface of the second silicon oxynitride film and the second tungsten film, the first titanium nitride film, and the first tantalum nitride film were embedded in the contact hole and the groove; accordingly, a plug and a second gate electrode were formed.

Next, a 10-nm-thick third silicon oxynitride film was formed by a CV) method, a 20-nm-thick hafnium oxide film was formed by an ALD method, and a 30-nm-thick fourth silicon oxynitride film was formed by a CVD method. The third silicon oxynitride film, the hafnium oxide film, and the fourth silicon oxynitride film serve as the second gate insulating film. Next, first heat treatment was performed in an atmosphere containing nitrogen at 400° C. for one hour.

Next, as a first oxide (S1), a 5-nm-thick In—Ga—Zn oxide was formed by a sputtering method. The S1 was formed under the following conditions: a target having an atomic ratio of In:GaZn=1:3:4 was used, the oxygen gas flow rate was 45 sccm, the pressure was 0.7 Pa, and the substrate temperature was 200° C.

Then, as a second oxide (S2), a 20-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, second heat treatment was performed. As the second heat treatment, treatment was performed in an atmosphere containing nitrogen at 400° C. for one hour, and subsequently another treatment was performed in an atmosphere containing oxygen at 400° C. for one hour.

Next, a 30-nm-thick second tantalum nitride film was formed over S2 by a sputtering method. Then, a 5-nm-thick third aluminum oxide film was formed over the second tantalum nitride film by an ALD method. Next, a 15-nm-thick third tungsten film was formed over the third aluminum oxide film by a sputtering method.

Next, a resist mask was formed by a lithography method. Using the resist mask as the etching mask, the third tungsten film in a region where a channel is formed was etched. Next, the resist mask was removed.

Next, the third tungsten film, the third aluminum oxide film, and the second tantalum nitride film were processed by a lithography method. Next, the S2 and the S1 were processed by a dry etching method.

Then, the second tantalum nitride film in a region where a channel is formed was etched. The third tungsten film over the third aluminum oxide film was also etched by the etching. A dry etching method was used for the etching.

Next, as a third oxide (S3), a 5-nm-thick In—Ga—Zn oxide was formed by a sputtering method. The S3 was formed under the following conditions: a target having an atomic ratio of In:GaZn=1:3:2 was used, the oxygen gas flow rate was 45 sccm, the pressure was 0.7 Pa, and the substrate temperature was 130° C.

Then, a 13-nm-thick fifth silicon oxynitride film functioning as a first gate oxide film was formed by a CVD method.

Next, third heat treatment was performed. The third heat treatment was performed in an atmosphere containing nitrogen at 400° C. for one hour.

Next, as a fourth oxide (S4), a 10-nm-thick In—Ga—Zn oxide was formed by a sputtering method. The fourth oxide was formed under the following conditions: a target having an atomic ratio of In:Ga:Zn=4:2:4.1 was used, the oxygen gas flow rate was 45 sccm, the pressure was 0.7 Pa, and the substrate temperature was 200° C.

Then, a 5-nm-thick second titanium nitride film was formed over the fourth oxide by a sputtering method and a 50-nm-thick fourth tungsten film was formed over the second titanium nitride film by a sputtering method. The second titanium nitride film and the fourth tungsten film were successively formed.

Next, fourth heat treatment was performed. The fourth heat treatment was performed in an atmosphere containing nitrogen at 400° C. for one hour.

Next, the fourth tungsten film, the second titanium nitride film, and the S4 were etched in this order by a lithography method, so that the first gate electrode was formed. A dry etching method was used for the etching of the fourth tungsten film and the second titanium nitride film, and a wet etching method was used for the etching of the fourth oxide.

Next, by a lithography method, the fifth silicon oxynitride film and the S3 were partly etched in this order. A dry etching method was used for the etching.

Next, a 7-nm-thick fourth aluminum oxide film was formed by an ALD method. The substrate temperature was 250° C.

Next, by a lithography method, part of the fourth aluminum oxide film was etched. A dry etching method was used for the etching.

Then, for Samples A and B, a 20-nm-thick fifth aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Next, a 5-nm-thick fifth aluminum oxide film was formed over the sixth aluminum oxide film by an ALD method. Then, a 430-nm-thick sixth silicon oxynitride film was formed over the sixth aluminum oxide film.

Then, third CMP treatment was performed to polish the sixth silicon oxynitride film so that the surface of the sixth silicon oxynitride film was planarized.

Then, a 40-nm-thick seventh aluminum oxide film was formed over the sixth silicon oxynitride film by a sputtering method under the following conditions: the argon gas flow rate was 25 sccm, the oxygen gas flow rate was 25 sccm, the pressure was 0.4 Pa, and the substrate temperature was 250° C.

Then, fifth heat treatment was performed. As the fifth heat treatment, treatment was performed in an atmosphere containing nitrogen at 400° C. for one hour, and subsequently another treatment was performed under an oxygen atmosphere at 400° C. for one hour.

Next, a 150-nm-thick seventh silicon oxynitride film was formed by a CVD method.

Next, a contact hole reaching the second tungsten film (the second gate electrode), a contact hole reaching the fourth tungsten film (the first gate electrode), and contact holes reaching the second tantalum nitride film (a source electrode and a drain electrode) were formed by a lithography method. A 40-nm-thick third tantalum nitride film was formed by a sputtering method. A 5-nm-thick third titanium nitride film was formed by an ALD method. A 250-nm-thick fifth tungsten film was formed by a CVD method.

Next, the fifth tungsten film, the third titanium nitride film, and the third tantalum nitride film were polished by fourth CMP treatment to reach the seventh silicon oxynitride film, so that the fifth tungsten film, the third titanium nitride film, and the third tantalum film were embedded in each contact hole to form plugs.

Next, a 20-nm-thick first titanium film, a 30-nm-thick fourth titanium nitride film, a 100-nm-thick first aluminum film, a 5-nm-thick second titanium film, and a 45-nm-thick fifth titanium nitride film were successively formed in this order by a sputtering method. Next, the first titanium film, the fourth titanium nitride film, the first aluminum film, the second titanium film, and the fifth titanium nitride film were partly etched to form a wiring layer by a lithography method.

Next, a 1000-nm-thick silicon oxide film was formed by a CVD method. Next, fifth CMP treatment was performed to planarize a surface of the silicon oxide film.

Then, a contact hole reaching the fourth titanium nitride film was formed by a lithography method. Subsequently, a 40-nm-thick fourth tantalum nitride film was formed by a sputtering method, a 5-nm-thick fourth titanium nitride film was formed by an ALD method, and a 250-nm-thick sixth tungsten film was formed by a CVD method.

Next, the sixth tungsten film, the fourth titanium nitride film, and the fourth tantalum nitride film were polished by fifth CMP treatment to reach the silicon oxide film, so that the sixth tungsten film, the fourth titanium nitride film, and the fourth tantalum nitride film were embedded in each contact hole to form plugs.

Next, a 50-nm-thick third titanium film, a 300-um-thick second aluminum film, and a 5-nm-thick fourth titanium film were successively formed in this order by a sputtering method. Then, the third titanium film, the second aluminum film, and the fourth titanium film were partly etched by a lithography method to form a wiring layer.

Next, a 1.6-μm-thick photosensitive polyimide film was formed by a coating method. Next, a portion of a polyimide film that is to be a measurement terminal (measurement pad) was removed by a lithography method. Next, heat treatment was performed at 300° C. for 1 hour, so that the polyimide film was baked.

Through the above process, the semiconductor device was manufactured.

Figure 22:
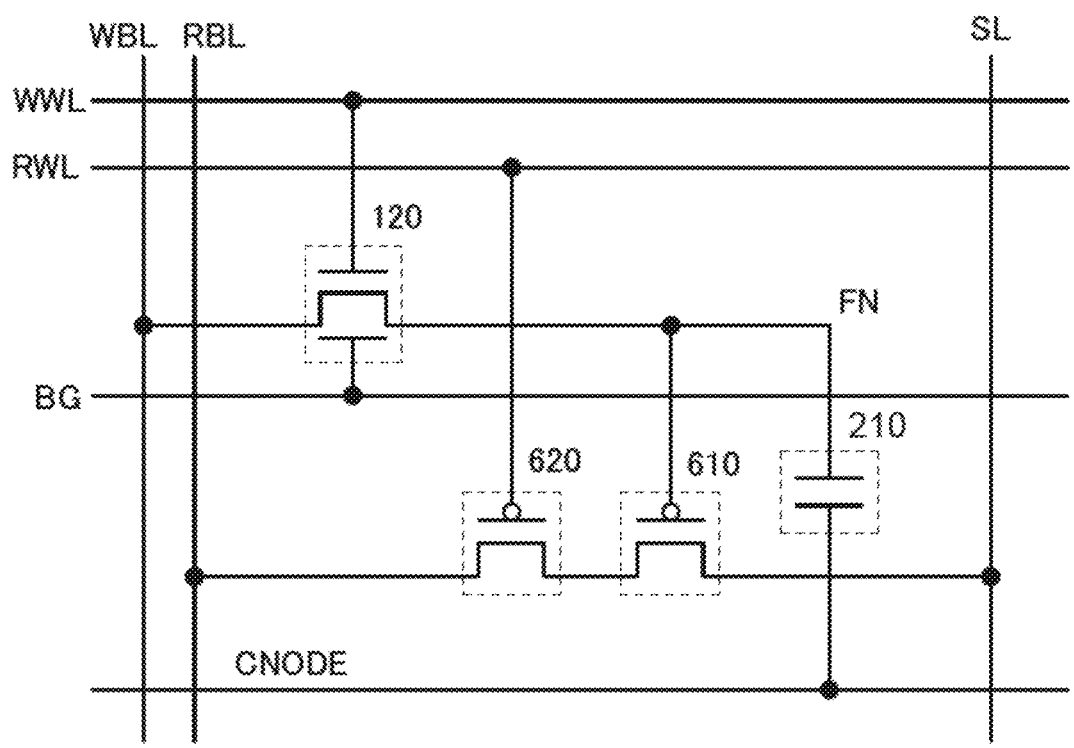
FIG. 22 is a circuit diagram of a memory cell.

Next, a memory retention test was conducted using the memory module included in the manufactured semiconductor device. A circuit diagram of a memory cell 1100 in the memory module is illustrated in FIG. 22.

The memory retention test was conducted using a module provided with 2000 memory cells 1100. Electric charge was written to the node FN using a transistor 120 illustrated in FIG. 22 and change over time in electric charge amount (voltage) was evaluated.

The memory cell 1100 includes the transistor 120, a transistor 610, a transistor 620, a capacitor 210, a first wiring WWL, a second wiring RWL, a third wiring SL, a fourth wiring WBL, a fifth wiring RBL, and a sixth wiring BG.

The first wiring WWL is electrically connected to a first gate of the transistor 120 and the second wiring RWL is electrically connected to a gate of the transistor 620. Furthermore, the third wiring SL is electrically connected to one of a source and a drain of the transistor 610. The fourth wiring WBL is electrically connected to one of a source and a drain of the transistor 120. The fifth wiring RBL is electrically connected to one of a source and a drain of the transistor 620. The sixth wiring BG is electrically connected to a second gate of the transistor 120. In addition, the other of the source and the drain of the transistor 120 and the gate of the transistor 610 are electrically connected to the node FN and one electrode of the capacitor 210, and the other electrode of the capacitor 210 is electrically connected to a node CNODE.

Next, the memory retention test is described. In FIG. 22, potential of the first wiring WWL was set to 4.5 V, so that the transistor 120 was turned on. Furthermore, a potential of the second wiring RWL was set to 1.2 V, so that the transistor 620 was turned on Here, a potential of the fourth wiring WBL was set to 1.2 V so that electric charge was supplied to the node FN electrically connected to the gate of the transistor 610 and one electrode of the capacitor 210. That is, High-level electric charge was supplied to the gate of the transistor 610 (writing). The potential of the sixth wiring BG was set to −8 V.

Next, the potential of the first wiring WWL was set to 0V and the transistor 120 was turned off so that electric charge is retained in the node FN (retention starts).

Next, the potential of the third wiring SL at the start of the retention was swept from 0.8 V to 3.3 V and a potential for turning on the transistor 610 was measured. The potential was represented by VSL and VSL at the start of the retention was represented by $VSL_T$.

The potential VSL was substantially equal to the potential of the node FN. Furthermore, due to leakage current, electric charge retained in the node FN decreases over time. In other words, the potential of the node FN decreases. In view of the above, a measurement of VSL was conducted after a certain period of time from the start of the retention to measure a variation of VSL with time elapsed after the start of the retention ($\Delta$VSL). Note that $\Delta$VSL at the start of the retention is considered 0 V; VSL decreases over time, so that $\Delta$VSL was negative. Here, the amount of $\Delta$VSL was determined from the absolute value of $\Delta$VSL. The elapsed time at which $\Delta$VSL becomes −0.6 V was the retention lifetime. A retention characteristic of 2000 memory cells, that is, 2000 bits was measured at different temperatures using the above-described measurement method.

Measurements of VSL at the start of the retention and 1 hour, 3 hours, 6 hours, 12 hours, 18 hours, 32 hours, 58 hours, 100 hours, and 150 hours after the start of the retention were conducted at 150° C. and $\Delta$VSL for each elapsed time was calculated.

Furthermore, measurements of VSL at the start of the retention and 1 hour, 3 hours, 6 hours, 12 hours, 18 hours, 32 hours, and 58 hours after the start of the retention were conducted at 135° C., and $\Delta$VSL for each elapsed time was calculated.

Furthermore, measurements of VSL at the start of the retention and 1 hour, 3 hours, 6 hours, 12 hours, 18 hours, 32 hours, 58 hours, 100 hours, 150 hours, and 200 hours after the start of the retention were conducted at 125° C. and $\Delta$VSL for each elapsed time was calculated.

Figure 23:
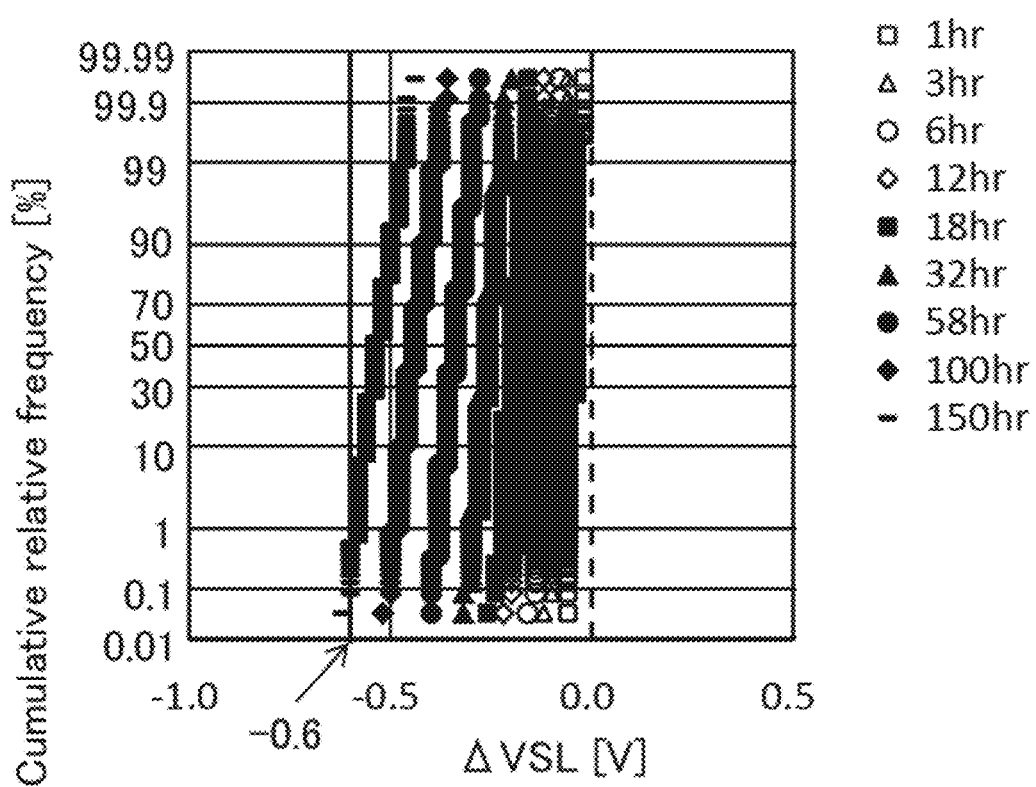
FIG. 23 is a graph showing cumulative distribution of $\Delta$VSL in Example.
Figure 24:
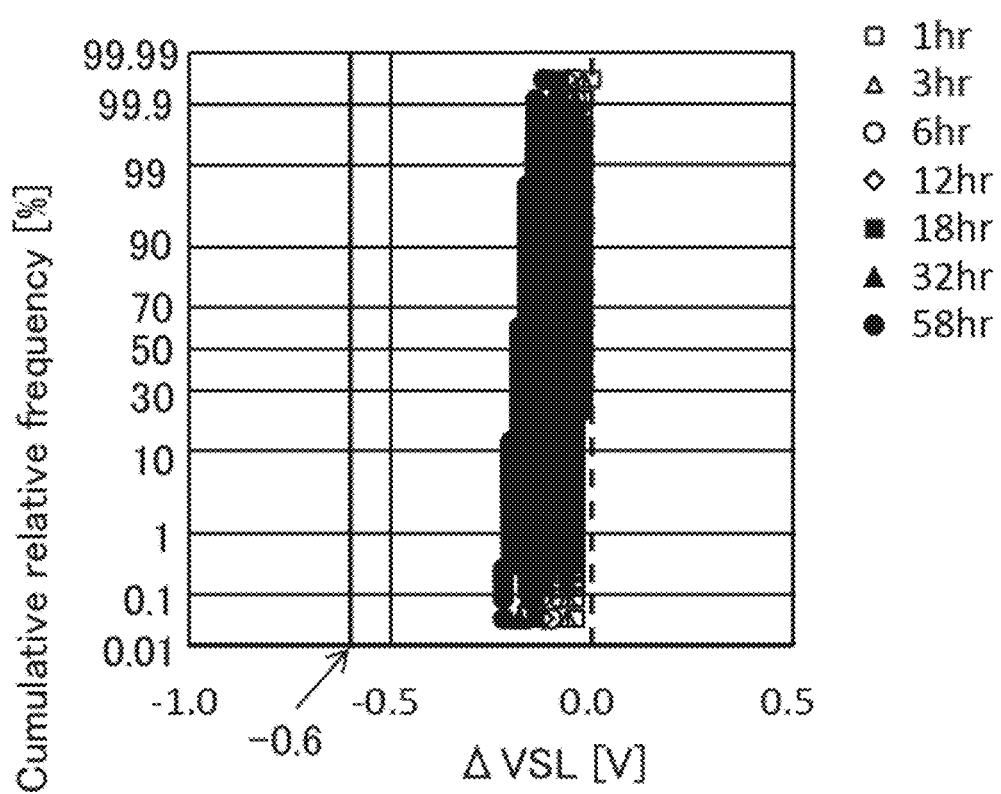
FIG. 24 is a graph showing cumulative distribution of $\Delta$VSL in Example.
Figure 25:
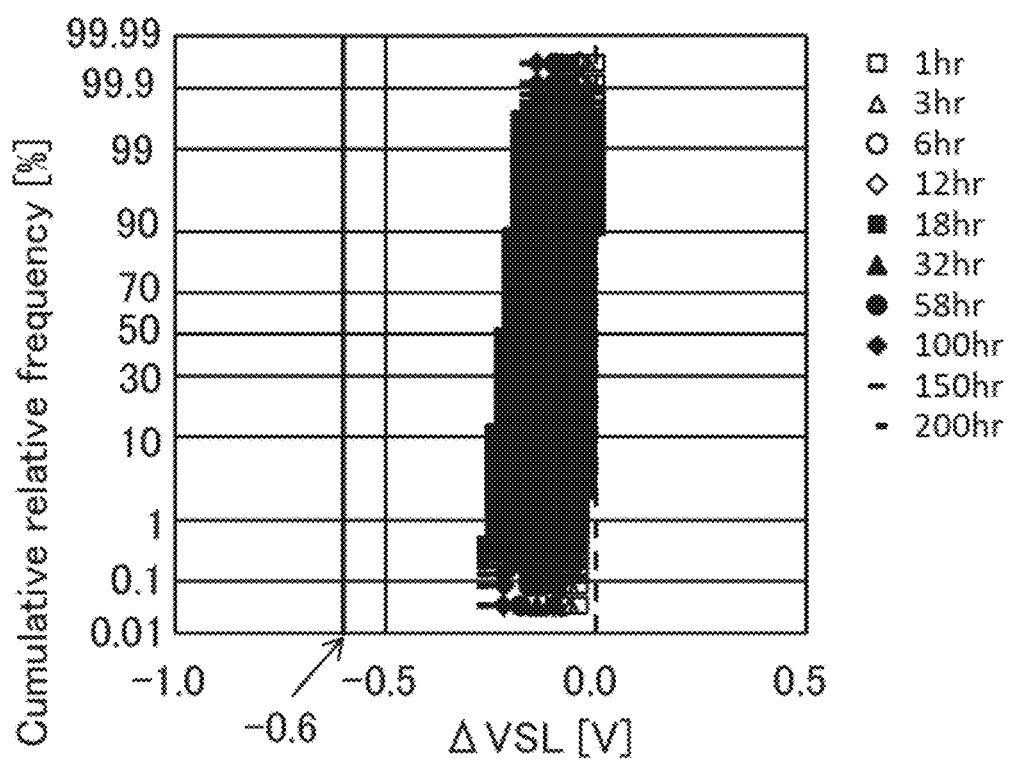
FIG. 25 is a graph showing cumulative distribution of $\Delta$VSL in Example.

FIGS. 23 to 25 are graphs showing cumulative distribution of $\Delta$VSL. The vertical axis represents a cumulative relative frequency, whereas the horizontal axis represents $\Delta$VSL. FIG. 23 is a graph in which cumulative distributions of $\Delta$VSL after each elapsed time at 150° C. are superposed and plotted. As the elapsed time increased, $\Delta$VSL tended to be larger. Furthermore, in an elapsed time of 250 hours, $\Delta$VSL exceeded −0.6 V in some of the bits; that is, the retention life was 250 hours. FIG. 24 is a graph in which cumulative distributions of $\Delta$VSL after each elapsed time at 135° C. are superposed and plotted. As the elapsed time increased. $\Delta$VSL tended to be larger; however, $\Delta$VSL of all bits was less than or equal to −0.6 V at an elapsed time of 58 hours. FIG. 25 is a graph in which cumulative distributions of $\Delta$VSL after each elapsed time at 125° C. are superposed and plotted. As the elapsed time increased, $\Delta$VSL tended to be larger; however, $\Delta$VSL of all bits was less than or equal to −0.6 V at an elapsed time of 200 hours.

Figure 26A:
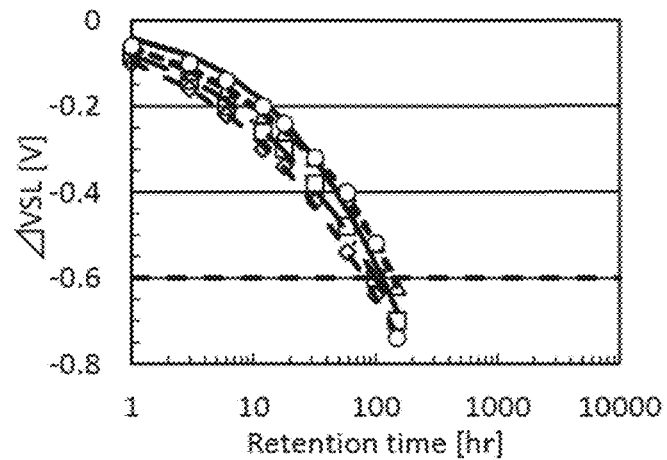
FIGS. 26A to 26C are graphs each showing lapse time dependence of $\Delta$VSL in Example.
Figure 26B:
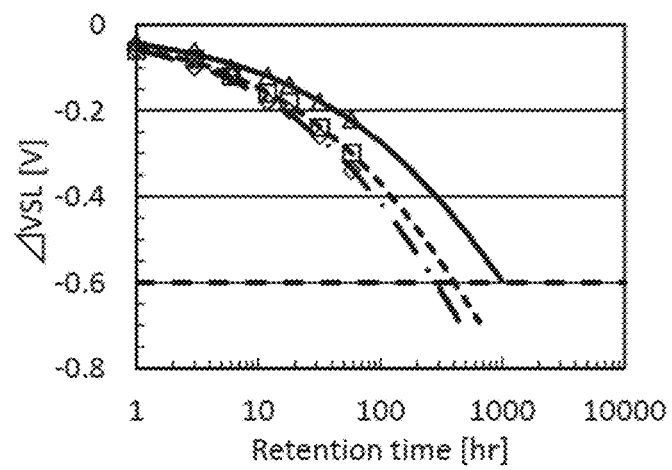
Figure 26C:
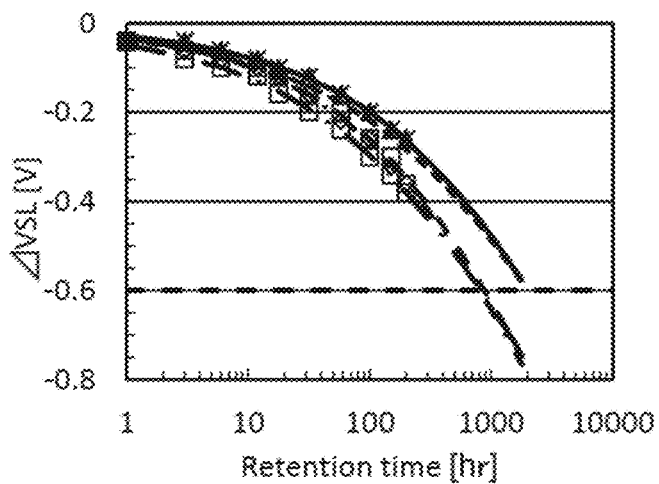

FIGS. 26A to 26C are graphs showing an elapsed time dependence of $\Delta$VSL. FIG. 26A is a graph in which 4-bit data with large $\Delta$VSL was extracted and plotted for each elapsed time at 150° C. and the plots were connected with a curved line. A time at which $\Delta$VSL was −0.6 V was calculated from the curved line. In other words, retention lifetimes of the 4 bits were 75 hours, 95 hours, 145 hours, and 110 hours.

FIG. 26B is a graph in which 3-bit data with large $\Delta$VSL was extracted and plotted for each elapsed time at 135° C. and $\Delta$VSL of all bits was less than or equal to −0.6 V; thus, a stretched exponential function curve was extrapolated, so that the time at which $\Delta$VSL is −0.6 V was calculated. As a result, retention lifetimes of 3 bits were 250 hours, 400 hours, and 1000 hours.

FIG. 26C is a graph in which 5-bit data with large $\Delta$VSL was extracted and plotted for each elapsed time at 125° C. and $\Delta$VSL of all bits was less than or equal to −0.6 V; thus, a stretched exponential function curve was extrapolated, so that the time at which $\Delta$VSL is −0.6 V was calculated. As a result, retention lifetime of 5 bits were 800 hours, 800 hours, 900 hours, 2000 hours, and 2000 hours.

Figure 27:
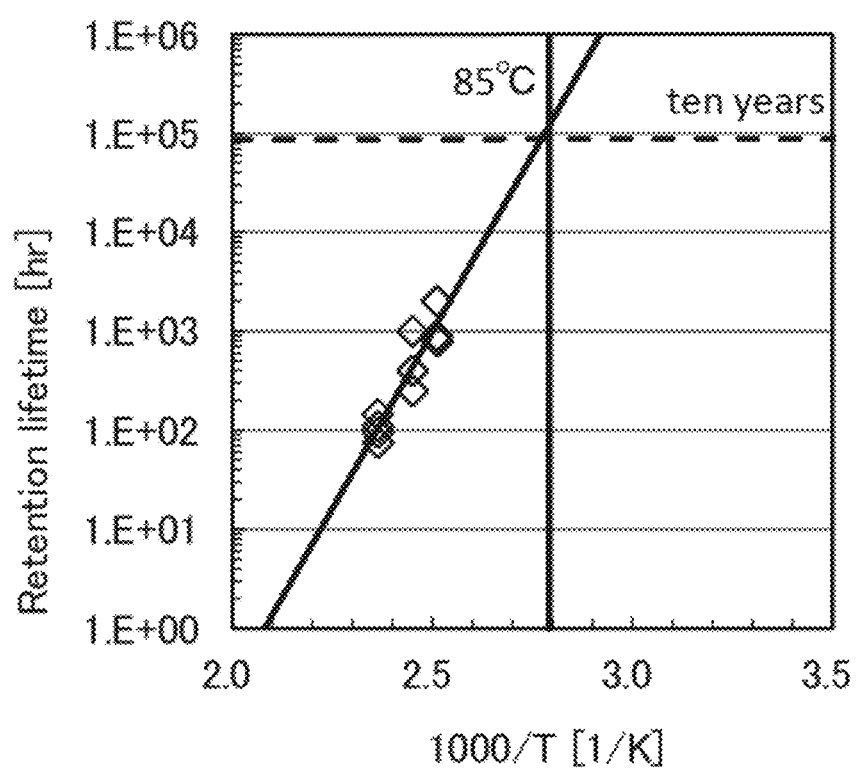
FIG. 27 is a graph of an Arrhenius plot of Example.

FIG. 27 shows a graph of an Arrhenius plot of the retention lifetime data in each environmental temperature calculated in FIGS. 26A to 26C. The vertical axis represents time of retention lifetime and the horizontal axis represents 1000/T in FIG. 27. Here, T represents an absolute temperature (K). An approximation formula was derived from the Arrhenius plot, and an activation energy of 1.41 eV and a retention lifetime of 13.8 years at 85° C. were obtained from the approximation formula.

This application is based on Japanese Patent Application Serial No. 2016-123177 filed with Japan Patent Office on Jun. 22, 2016 and Japanese Patent Application Serial No. 2016-186855 filed with Japan Patent Office on Sep. 26, 2016, the entire contents of which are hereby incorporated by reference.

What is claimed is:

1. A semiconductor device comprising:
    a semiconductor substrate;
    a first memory cell over the semiconductor substrate comprising a first transistor and a first capacitor connected to a first conductor functioning as one of a source electrode and a drain electrode of the first transistor; and
    a second memory cell over the semiconductor substrate comprising a second transistor and a second capacitor connected to a third conductor functioning as one of a source electrode and a drain electrode of the second transistor,
    wherein the first transistor comprises:
        a first oxide;
        a first gate electrode;
        a second gate electrode;
        a first gate insulator between the first oxide and the first gate electrode;
        the first conductor and a second conductor in contact with the first oxide;
        a second oxide in contact with the first oxide and located between the first gate insulator and the first oxide; and
        a second gate insulator between the first oxide and the second gate electrode,
    wherein the second transistor comprises:
        a third oxide;
        the first gate electrode;
        the second gate electrode;
        a third gate insulator between the third oxide and the first gate electrode;
        the third conductor and a fourth conductor in contact with the third oxide;

the second oxide in contact with the third oxide and located between the third gate insulator and the third oxide; and the second gate insulator between the third oxide and the second gate electrode, wherein the second gate electrode comprises a first region overlapping with the second oxide and a second region extending beyond a perimeter portion of the second oxide, and wherein the second region is located between a first connection region of the first transistor and the first capacitor and a second connection region of the second transistor and the second capacitor.

2. The semiconductor device according to claim 1, wherein the first conductor is located over the first oxide, and wherein the second conductor is located over the first oxide.

3. The semiconductor device according to claim 1, wherein the first oxide and the third oxide function as a channel, and wherein the second conductor and the fourth conductor function as the other one of a source electrode or a drain electrode of the first transistor and the second transistor, respectively.

4. The semiconductor device according to claim 1, wherein the first to third oxides include an oxide semiconductor.

5. The semiconductor device according to claim 1, wherein the first gate insulator and the third gate insulator are parts of a common gate insulator.

6. A semiconductor device comprising:
a semiconductor substrate;
a first memory cell over the semiconductor substrate comprising a first transistor and a first capacitor connected to a first conductor functioning as one of a source electrode and a drain electrode of the first transistor; and
a second memory cell over the semiconductor substrate comprising a second transistor and a second capacitor connected to a third conductor functioning as one of a source electrode and a drain electrode of the second transistor,
wherein the first transistor comprises:
a first semiconductor oxide;
a first gate electrode;
a second gate electrode;
a first gate insulator between the first semiconductor oxide and the first gate electrode;
the first conductor and a second conductor in contact with the first semiconductor oxide;
a second semiconductor oxide in contact with the first semiconductor oxide and located between the first gate insulator and the first semiconductor oxide; and
a second gate insulator between the first semiconductor oxide and the second gate electrode,
wherein the second transistor comprises:
a third semiconductor oxide;
the first gate electrode;
the second gate electrode;
a third gate insulator between the third semiconductor oxide and the first gate electrode;
the third conductor and a fourth conductor in contact with the third semiconductor oxide;
the second semiconductor oxide in contact with the third semiconductor oxide and located between the third gate insulator and the third semiconductor oxide; and
the second gate insulator between the third semiconductor oxide and the second gate electrode,
wherein the second gate electrode comprises a first region overlapping with the second semiconductor oxide and a second region extending beyond a perimeter portion of the second semiconductor oxide,
wherein the second region is located between a first connection region of the first transistor and the first capacitor and a second connection region of the second transistor and the second capacitor, and
wherein a termination portion of the second gate electrode comprises a region extending beyond a termination portion of the second semiconductor oxide.

7. The semiconductor device according to claim 6, wherein the first conductor is located over the first semiconductor oxide, and wherein the second conductor is located over the first semiconductor oxide.

8. The semiconductor device according to claim 6, wherein the first semiconductor oxide and the third semiconductor oxide function as a channel, and wherein the second conductor and the fourth conductor function as the other one of a source electrode or a drain electrode of the first transistor and the second transistor, respectively.

9. The semiconductor device according to claim 6, wherein the first gate insulator and the third gate insulator are parts of a common gate insulator.

* * * * *